(12) United States Patent
Kido et al.

(10) Patent No.: US 6,731,670 B1
(45) Date of Patent: May 4, 2004

(54) METHOD AND CIRCUIT FOR GENERATING SPREADING CODES

(75) Inventors: Naoshige Kido, Yokohama (JP); Naoyuki Kurihara, Yokohama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 589 days.

(21) Appl. No.: 09/634,996

(22) Filed: Aug. 8, 2000

(51) Int. Cl.⁷ .................................................. G06F 7/58
(52) U.S. Cl. ........................................ 375/140; 708/253
(58) Field of Search ................................ 375/140, 146; 708/250, 252, 253, 256

(56) References Cited

U.S. PATENT DOCUMENTS

| | | | |
|---|---|---|---|
| 5,257,282 A | * 10/1993 | Adkisson et al. | ............ 708/253 |
| 5,438,596 A | 8/1995 | Sugita | |
| 5,583,884 A | 12/1996 | Maruyama et al. | |
| 5,654,979 A | 8/1997 | Levin et al. | |
| 5,835,488 A | 11/1998 | Sugita | |
| 5,881,100 A | 3/1999 | Durrant et al. | |
| 5,931,893 A | 8/1999 | Dent et al. | |

FOREIGN PATENT DOCUMENTS

| | | |
|---|---|---|
| JP | 56-12120 | 2/1981 |
| JP | 61-173525 | 8/1986 |
| JP | 7-107006 | 4/1995 |
| JP | 8-18550 | 1/1996 |
| JP | 8-321748 | 12/1996 |
| JP | 10-308720 | 11/1998 |
| JP | 11-4144 | 1/1999 |
| JP | 2000-151367 | 5/2000 |
| WO | 0042711 | 7/2000 |

OTHER PUBLICATIONS

English Language Abstract of JP 7–107006.

* cited by examiner

*Primary Examiner*—Stephen Chin
*Assistant Examiner*—Kevin Kim
(74) *Attorney, Agent, or Firm*—Greenblum & Bernstein, P.L.C.

(57) ABSTRACT

A spreading code generator provides a parallel output of plural-bit spreading codes by use of vector operations. A data circulating loop is formed that comprises a register capable of a parallel plural-bit input and output, a vector multiplier, and a selector. Each of the data pieces output in parallel from the register is multiplied by a vector operation coefficient, thereby providing a certain amount of shift to each of the data pieces. The data after the vector operation is again set in the register, after which the same operation is repeated. The plural-bit spreading codes are thereby generated in parallel in a successive manner

20 Claims, 18 Drawing Sheets

| CLK | A | B | C | LC |
|---|---|---|---|---|
| 0 | 1 | 1 | 1 | |
| 1 | 0 | 1 | 1 | 1 |
| 2 | 0 | 0 | 1 | 1 |
| 3 | 1 | 0 | 0 | 1 |
| 4 | 0 | 1 | 0 | 0 |
| 5 | 1 | 0 | 1 | 0 |
| 6 | 1 | 1 | 0 | 1 |
| 7 | 1 | 1 | 1 | 0 |
| 8 | 0 | 1 | 1 | 1 |
| 9 | 0 | 0 | 1 | 1 |
| 10 | 1 | 0 | 0 | 1 |
| 11 | 0 | 1 | 0 | 0 |
| 12 | 1 | 0 | 1 | 0 |
| 13 | 1 | 1 | 0 | 1 |
| 14 | 1 | 1 | 1 | 0 |

FIG. 7A

| $a_{17}$ | $a_{16}$ | $a_{15}$ | $a_{14}$ | $a_{13}$ | $a_{12}$ | $a_{11}$ | $a_{10}$ | $a_{09}$ | $a_{08}$ | $a_{07}$ | $a_{06}$ | $a_{05}$ | $a_{04}$ | $a_{03}$ | $a_{02}$ | $a_{01}$ | $a_{00}$ |
|---|---|---|---|---|---|---|---|---|---|---|---|---|---|---|---|---|---|
| $2^{17}$ | $2^{16}$ | $2^{15}$ | $2^{14}$ | $2^{13}$ | $2^{12}$ | $2^{11}$ | $2^{10}$ | $2^{9}$ | $2^{8}$ | $2^{7}$ | $2^{6}$ | $2^{5}$ | $2^{4}$ | $2^{3}$ | $2^{2}$ | $2^{1}$ | $2^{0}$ |

MSB ← → LSB

FIG. 7B $$(A^1)^{(a17 \cdot 2^{17} + a16 \cdot 2^{16} + a15 \cdot 2^{15} + a14 \cdot 2^{14} + a13 \cdot 2^{13} + a12 \cdot 2^{12} + a11 \cdot 2^{11} + a10 \cdot 2^{10} + a09 \cdot 2^{9} + a08 \cdot 2^{8} + a07 \cdot 2^{7} + a06 \cdot 2^{6} + a05 \cdot 2^{5} + a04 \cdot 2^{4} + a03 \cdot 2^{3} + a02 \cdot 2^{2} + a01 \cdot 2^{1} + a00 \cdot 2^{0})}$$

$$= (A^{2^{15}})^{a17 \cdot 2^{2}} \cdot (A^{2^{15}})^{a16 \cdot 2^{1}} \cdot (A^{2^{15}})^{a15 \cdot 2^{0}} \cdot (A^{2^{12}})^{a14 \cdot 2^{2}} \cdot (A^{2^{12}})^{a13 \cdot 2^{1}} \cdot (A^{2^{12}})^{a12 \cdot 2^{0}} \cdot (A^{2^{9}})^{a11 \cdot 2^{2}} \cdot (A^{2^{9}})^{a10 \cdot 2^{1}} \cdot (A^{2^{9}})^{a09 \cdot 2^{0}} \cdot (A^{2^{6}})^{a08 \cdot 2^{2}} \cdot (A^{2^{6}})^{a07 \cdot 2^{1}} \cdot (A^{2^{6}})^{a06 \cdot 2^{0}} \cdot (A^{2^{3}})^{a05 \cdot 2^{2}} \cdot (A^{2^{3}})^{a04 \cdot 2^{1}} \cdot (A^{2^{3}})^{a03 \cdot 2^{0}} \cdot (A^{2^{0}})^{a02 \cdot 2^{2}} \cdot (A^{2^{0}})^{a01 \cdot 2^{1}} \cdot (A^{2^{0}})^{a00 \cdot 2^{0}}$$

|  | DESIRED-NUMBER-OF-STEPS SHIFT | SUCCESSIVE SPREAD CODE OUTPUT METHOD | USE OF BIT-CIRCULATIVE SHIFT REGISTER OUTPUT |
|---|---|---|---|
| PRIOR ART | VECTOR MULTIPLICATION | VECTOR MULTIPLICATION | VECTOR MULTIPLICATION |
| PRESENT INVENTION | VECTOR MULTIPLICATION | VECTOR MULTIPLICATION | VECTOR MULTIPLICATION |

FIG. 18

METHOD AND CIRCUIT FOR GENERATING SPREADING CODES

BACKGROUND OF THE INVENTION

1. Field of the Invention

The present invention relates to a spreading code generation method and a spreading code generating circuit.

2. Description of the Related Art

Spreading spectrum communication, in particular CDMA (code division multiple access) method implement high-quality speech communications or high-speed data communications. The CDMA is the mainstream of mobile communication methods.

In W-CDMA mobile communication system including a plurality of asynchronously operating base stations, a rapid establishment of the initial synchronizing process is needed. The rapid establishment of the initial synchronization is a key factor for keeping excellent speech qualities or expanding battery services at mobile terminals.

Upon the power-on of the mobile terminals or upon the base station-to-base station handover, synchronism with the base station has to first be established. The establishment of the initial synchronization necessitates spreading codes in a predetermined phase.

A slow spreading code generation speed may impede the rapid initial synchronization establishment.

The spreading codes can typically be M-sequence (maximum-length linearly recurring sequence) spreading codes.

The M-sequence spreading codes are generated by use of a "bit circulative shift register". The generation of the spreading codes by the bit circulative shift register is effected in accordance with the following procedure.

Data is first fetched from a specific tap of a shift register, which is determined by an M-sequence generator polynomial. The thus fetched data is then added to an output of the shift register. The result of addition is then returned to a first step of the shift register. The above operations are iterated. The M-sequence spreading codes are thus generated with the data cycled.

Such an operation as merely sending data in sequence from the bit circulative shift register will take a substantial time to shift the phase of the spreading code by a desired amount. A technique is thus proposed that uses vector multiplication to implement a rapid phase shift (Japanese Patent Laid-open Pub. No. Hei7-107006).

In the technique disclosed in this publication, the spreading codes serially output from an M-sequence generator (bit circulative shift register) are multiplied by a vector imparting a predetermined shift thereto, with the result that the phase of the spreading codes is shifted by the desired number of steps.

To achieve a high-speed output of the spreading codes by use of the bit circulative shift register, it is necessary to increase shift clock frequencies of the shift register, or alternatively to simultaneously operate a plurality of the bit circulative shift registers.

A limitation may however be imposed on enhancement of the operating speed of the bit circulative shift register. Furthermore, the parallel operation of the bit circulative shift registers will incur the increased circuit scale, resulting in an increase in costs and dissipation currents.

The technique disclosed in Japanese Patent Laid-open Pub. No. Hei7-107006 achieves a rapid phase shift of the spreading codes. The speed per se of successively generating the M-sequence spreading codes depends on the operating speed of the M-sequence generator (bit circulative shift register).

Thus, from a standpoint of successive generation of the spreading codes there still remain problems of a possible limitation arising from the register's performance and of a rise in power consumption and costs.

SUMMARY OF THE INVENTION

It is therefore the object of the present invention to remarkably enhance the speed per se of successively generating the sequential spreading codes while suppressing the power consumption and costs.

The present invention makes no use of the bit circulative shift register for generating the spreading codes. Instead, vector operations are effected in sequence to generate the spreading codes in a successive manner.

Data is provided in parallel as output from each of taps of the shift register having a predetermined bit count. Each parallel output data is multiplied by a vector operation coefficient. This imparts to each data a phase shift corresponding to the number of taps of the shift register.

Each phase shifted data is then fed in parallel to the shift register.

These operations are iterated so that the spreading codes are output in parallel and in a successive manner.

In one aspect of a spreading code generation method according to the present invention, n-bit data corresponding to data retained in the bit circulative shift register is provided as parallel output. Each parallel data is then multiplied by a vector operation coefficient so that an n-bit (n-step) phase shift is imparted to each data. These operations are then iterated to provide spreading codes as successive and high-speed output.

In another aspect of the spreading code generation method according to the present invention, upon the completion of generation of a single spreading code sequence, each data stored in the shift register is multiplied by the vector operation coefficient. This allows the phase to shift at a stretch up to the initial state of the spreading code sequence to next be generated. It is thus possible to immediately start the generation of the next spreading code sequence.

In one aspect of a spreading code generating circuit according to the present invention, a closed loop for data cycling is formed by the mutual connections of a register, a vector operating circuit and a selector. With the data cycled, plural-bit spreading codes are provided as parallel output. This achieves a rapid, successive spreading code generation.

In another aspect of the spreading code generating a circuit according to the present invention, a single vector multiplier is shared by a plurality of registers.

The initial synchronism can be established at an earlier stage in the mobile communications by mounting a correlation detecting circuit that incorporates the spreading code generating circuit according to the present invention on mobile communication terminals or mobile communication systems. The provision to the user of pleasant mobile communication environments is thus achieved.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which;

FIG. 7A is an illustration representing the amount of phase shift by 18-bit binary digit;

FIG. 7B is an illustration for explaining the contents of the vector operation (and a vector operation coefficient) for imparting a desired phase shift to the spreading codes;

FIG. 18 is an illustration showing characteristics of the present invention with respect to the prior art.

DESCRIPTION OF THE PREFERRED EMBODIMENTS

The present invention will now be described with reference to the accompanying drawings which illustrate preferred embodiments thereof in a non-limitative manner.

Reference is first made to FIGS. 1 to 4 to explain a basic concept of the present invention.

Figure 1:
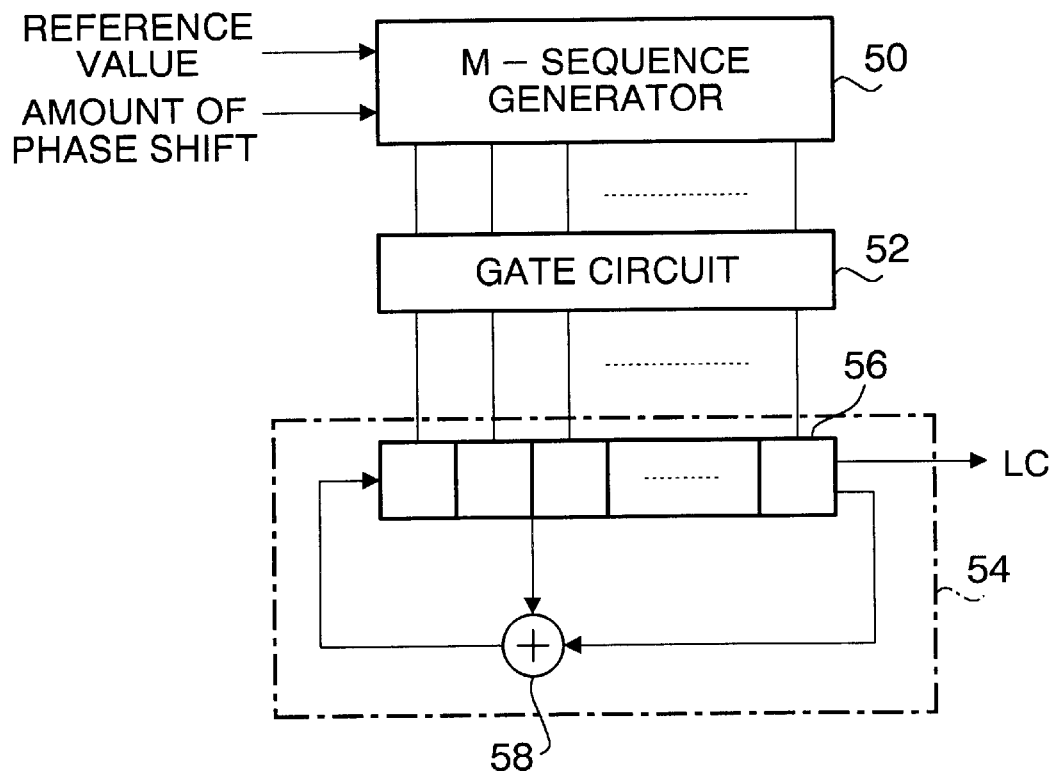
FIG. 1 is a block diagram showing a basic configuration of a conventional cyclic spreading code generator.

FIG. 1 shows a generic example of an M-sequence spreading code generation method.

In a circuit shown in FIG. 1, an M-sequence generator 50 generates an M-sequence initial value. The generated initial value is fed via a gate circuit 52 to a bit circulative shift register 54.

A bit circulative shift register 54 comprises as its elements a shift register 56 and an adder 58.

The M-sequence initial value is set to the shift register 56. Data shift is then initiated to generate an M-sequence spreading code with the data cycled.

In FIG. 1, the M-sequence spreading code is designated at LC. This M-sequence spreading code LC is, e.g. a frame synchronization establishing spreading code.

Incidentally, an M-sequence generator polynomial determines the number of taps of the bit circulative shift register and from which tap the data is to be fetched for the impartment to the adder 58.

Figure 2:
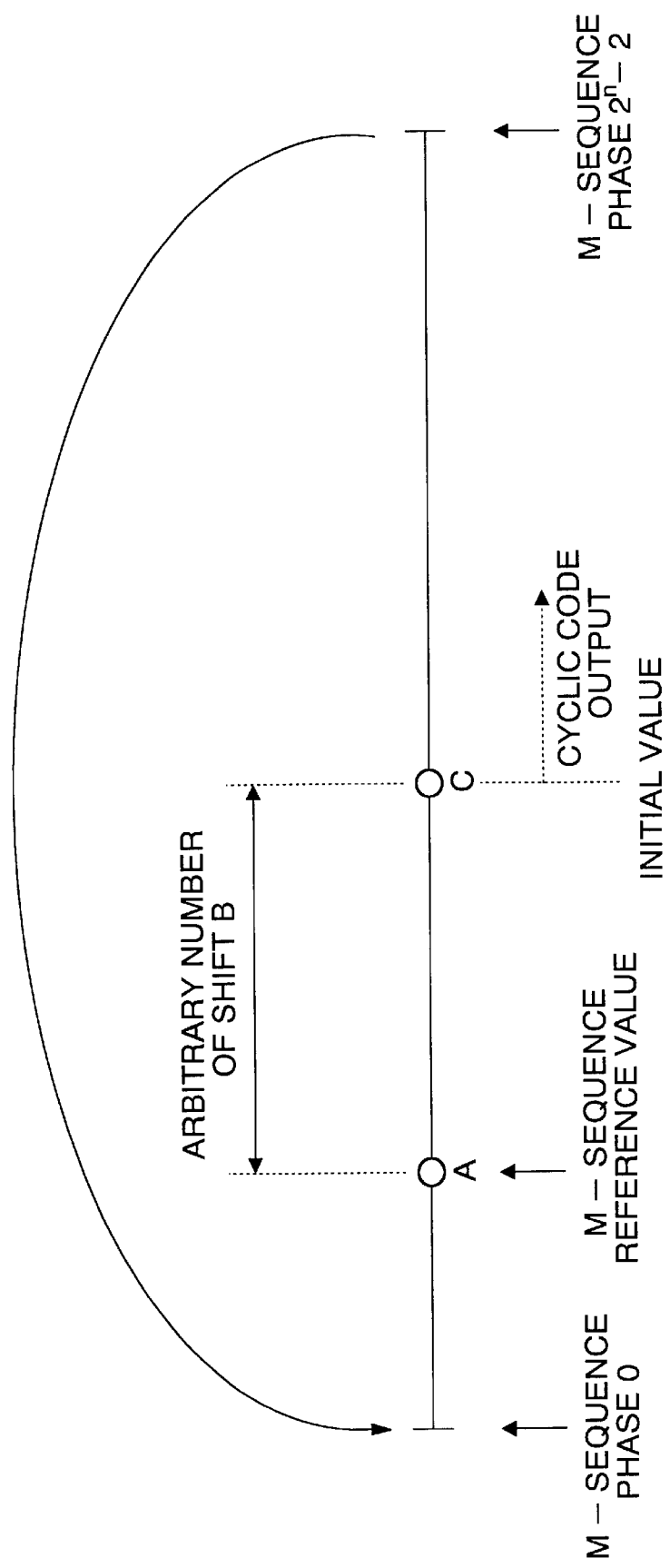
FIG. 2 is an illustration for explaining a method of generating initial values of cyclic spreading codes.

FIG. 2 depicts a major process up to the generation of the spreading code LC by means of a circuit of FIG. 1.

That is, in the circuit of FIG. 1, a reference value A is first fed to the M-sequence generator 50. This reference value is subjected to a predetermined amount of phase shift B to generate an initial value C.

The cyclic operation is then initiated from the initial value C by the shift register. Data (spreading code) is serially output bit by bit from the shift register.

Incidentally, the M-sequence spreading code generated by the bit circulative shift register of the number of tap n has a cycle of $2^n-1$, with the M-sequence generator polynomial of FIG. 2 expressed as $X^{18}+X^7+1$.

In the above expression, the symbol ^ stands for the power, e.g. $2^n-1$ means $2^N-1$. This applies to the following description.

Due to the bit-by-bit serial output of the spreading codes LC from the shift register in the circuit of FIG. 1, the spreading code generation speed has a limitation attributable to the performance of the shift register.

The circuit parallel operation aiming at a higher speed generation would cause an abrupt rise in the circuit scale and power consumption.

Discussion will thus be made hereinbelow.

Figures 3A, 3B:
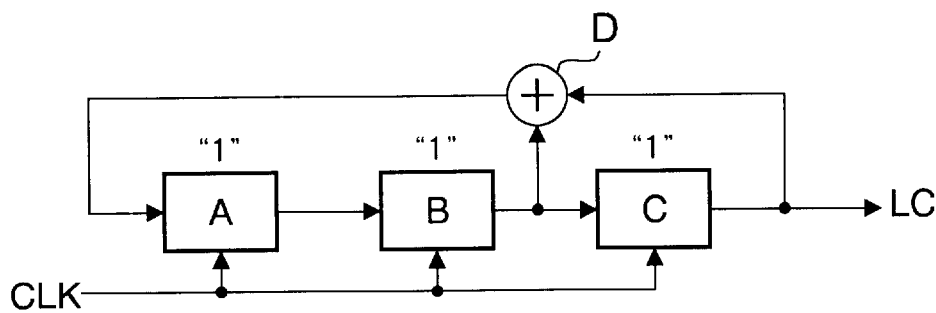
FIG. 3A is a diagram showing a basic configuration of a bit circulative shift register.
FIG. 3B is an illustration showing, with the lapse of time, the contents of bit circulative shift register retention data and serially output spreading codes.

Assumed is the case where the spreading codes are generated by use of a bit circulative shift register having three memory elements A, B and C shown in FIG. 3A.

As shown in FIG. 3B, with the lapse of time, the spreading codes LC are output on a bit-by-bit basis from the shift register.

The fact to be noticed herein is that data stored so far is output as if it is extruded one bit at a time since the shift register is a sort of memory circuit.

For example, in FIG. 3B, data "111" lying in the shift register at a point CLK(0) is in sequence output at input timings of CLK(1), CLK(2) and CLK(3).

In other words, the output data "111" is one which has already been stored in the shift register at the point CLK(0).

This means that parallel fetch of data retained in the shift register storage elements (taps) with the data stored (at point CLK(0)) will allow a simultaneous generation of spreading codes corresponding to the bit count of the shift register without need to wait for the bit-by-bit data extrusion from the shift register.

Figure 4A:
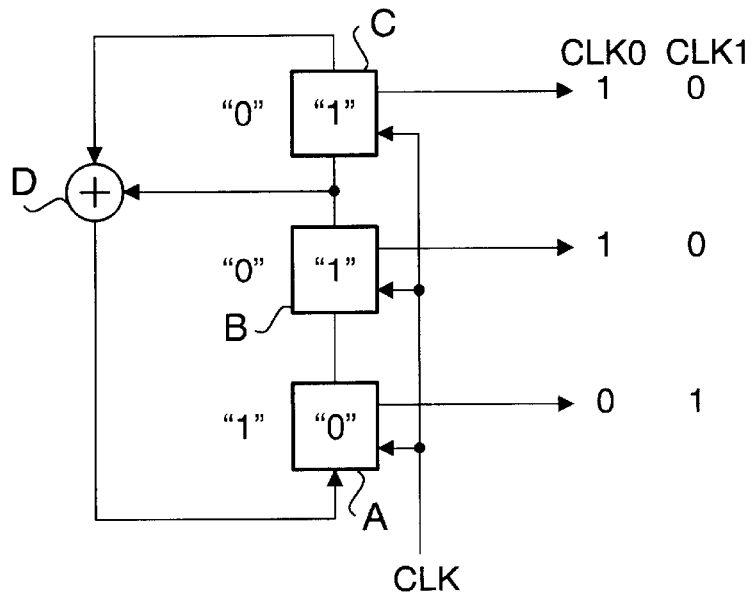
FIG. 4A is a diagram for explaining characteristics of a spreading code generation method according to the present invention.
Figure 4B:
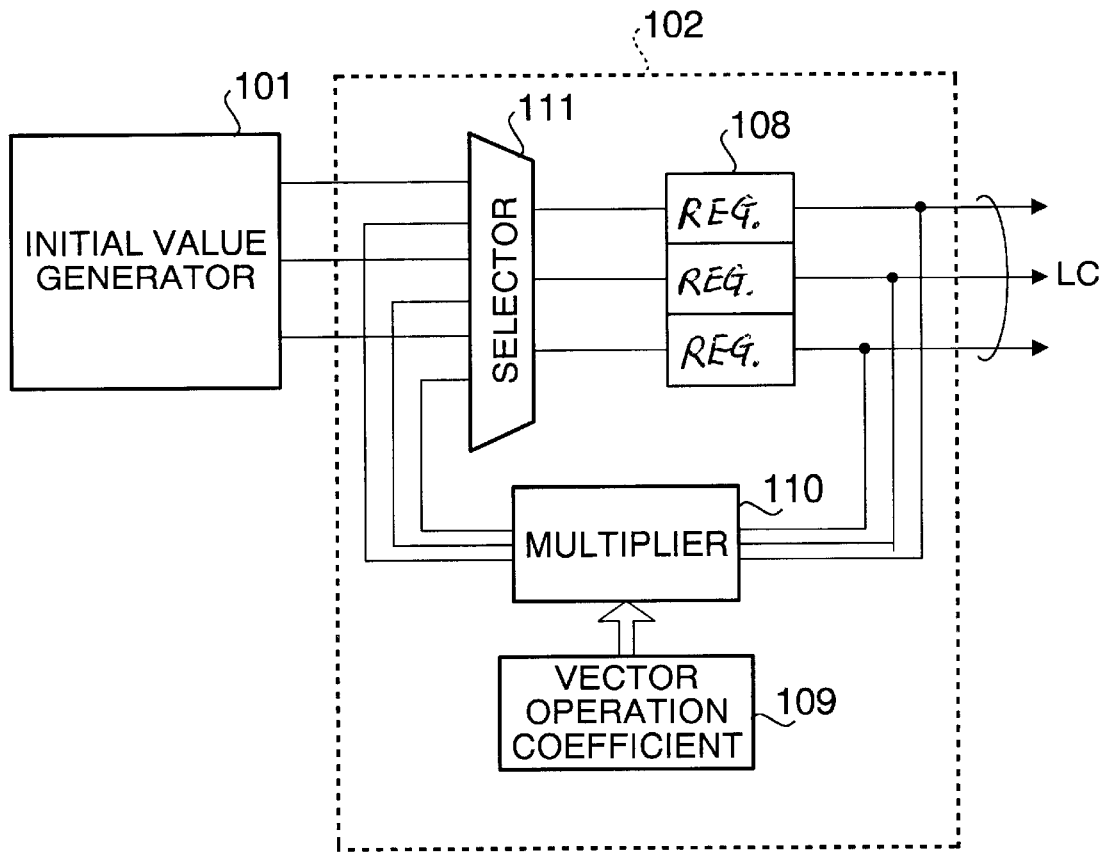
FIG. 4B is a block diagram showing a basic configuration of a spreading code generating circuit according to the present invention.

FIGS. 4A and 4B show this concept.

However, even in case of parallel generation of plural-bit spreading codes, data succession (sequence) of the generated spreading codes must be maintained, similarly to the prior art.

In case of FIG. 3B for example, successive formations of three-clock-based status such as CLK(0) status, CLK(3) status and CLK(6) status are required.

The phase of the spreading codes needs to be shifted at a stretch by the number of steps corresponding to the bit count of the shift register.

Thus, the present invention makes use of a vector operation to shift the spreading code phase by the number of steps corresponding to the shift register bit count.

The vector operation is simultaneously executed for each of a plurality of data output in parallel from the shift register.

In the present invention, iteration is made of the operation of updating all bit data of the shift register at the same timing, to provide a parallel output of the spreading codes.

This method is based on quite a novel conception, different from the prior art. In other words, it is basically different from the conventional method of providing serial bit-by-bit output of the cyclic codes from the register.

In this manner, for each of data of the respective register taps, the present invention makes use of the vector operation for shifting the phase by the number of steps corresponding to the bit count of the register.

FIG. 4B shows a fundamental circuit configuration for implementing the generation of spreading codes by such a vector operation.

As shown, a spreading code initial value is output from an initial value generator 101.

The spreading code initial value (3 bits) is set in parallel to a register 108 via a selector 111. The register 108 is of a type capable of parallel input and output.

3-bit memory data is then output in parallel from the register 108.

Each of the 3-bit data output is multiplied by a vector operation coefficient. This multiplication of the vector operation coefficient is effected in a vector multiplier 110. As a result, each data experiences a phase shift by the number of taps corresponding to the register bit count.

The phase-shifted data is fed back via a selector 111 to the register 108 for being set in parallel thereto.

Such operations are iterated to successively generate in parallel a corresponding number of spreading codes to the bit count (the number of taps) of the register 108.

A data cycling closed loop is formed by the mutual connections of the selector 111, the register 108 and the multiplier.

In FIG. 4B, reference numerals 102 and 109 denote a circular shift operation circuit and a circuit for providing a desirable vector operation coefficient, respectively.

The basic items of the spreading code generation method of the present invention have hereinabove been set forth.

Embodiments of the present invention will more specifically be described below with reference to the accompanying drawings.

Embodiment 1

Figure 5:
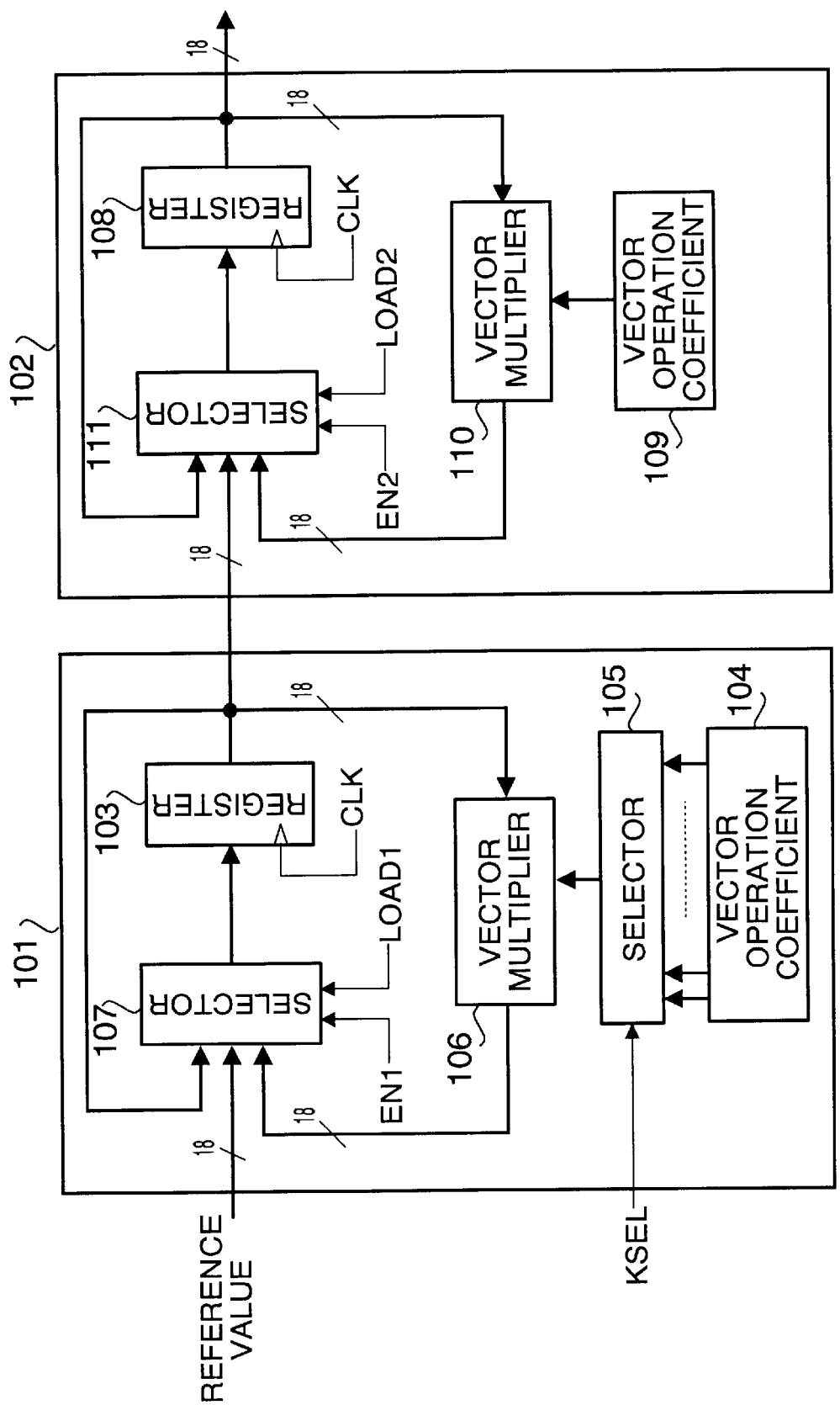
FIG. 5 is a block diagram of the spreading code generating circuit according to a first embodiment of the present invention.

FIG. 5 is a block diagram showing a configuration of a spreading code generating circuit according to a first embodiment of the present invention.

This spreading code generating circuit comprises an initial value generation circuit 101 and a circular shift operation circuit 102.

The circular shift operation circuit 102 generates cyclic spreading codes in a successive manner by use of a vector operation based on an initial value.

The initial value generation circuit 101 includes a selector 107, a 18-bit register 103 allowing parallel input and parallel output, an 18-bit output vector multiplier 106, a vector operation coefficient output circuit 104, and a selector 105 for selecting a vector operation coefficient.

The selection of data by the selector 107 is effected on the basis of an enable signal EN1 and a load signal LOAD1.

The selector 107 switchingly selects any one of feedback to the register 103 of the output of the register 103, storage into the register 103 of the externally fed reference value, and storage into the register 103 of the output of the vector multiplier 106.

The vector multiplier 106 multiplies the output of the register 103 by a vector operation coefficient.

The vector operation coefficient for use in the operation is selected by the selector 105 from a plurality of vector operation coefficients output from the vector operation coefficient output circuit 104. The selector receives a control signal (KSEL) for providing a control of selection of the operation coefficients.

The circular shift operation circuit 102 has also the same configuration as the initial value generation circuit 101.

That is, the circular shift operation circuit 102 includes a selector 111, an 18-bit register 108 allowing parallel input and parallel output, a vector operation coefficient output circuit 109, and an 18-bit output vector multiplier 110.

A data selection of the selector 111 is effected based on an enable signal EN2 and a load signal LOAD2.

This selector 111 switchingly selects any one of the feedback to the register 108 of the output of the resistor 108, the storage into the register 103 of the initial value, and the storage into the register 108 of the output of the vector multiplier 110.

Specific description will hereinbelow be made of a method of generating the M-sequence spreading codes by use of the vector operation.

The vector operation effected in the initial value generator 101 of FIG. 5 will first be described.

Incidentally, a generator polynomial of the M-sequence spreading codes to be generated is given as $X^{18}+X^7+1$.

Let C(n) and P(t) be an initial value and a vector operation coefficient indicative of the amount of phase shift, respectively. If C(n) is multiplied by P(t), then a spreading code C(n+t) is acquired whose phase is shifted by P(t) from the initial value C(n).

Such a vector operation is expressed as:

$$C(n+t)=P(t) \cdot C(n)$$

Description will be made of a manner of acquiring the vector operation coefficient used herein.

Let $X^{18}+X^7+1$ be a M-sequence spreading code generator polynomial. The amount of the phase shift is set to 1. The vector operation coefficient $P(1)$ in this case is represented as follows.

$$\begin{vmatrix} 0 & 0 & 0 & 0 & 0 & 0 & 0 & 0 & 0 & 1 & 0 & 0 & 0 & 0 & 0 & 0 & 0 & 1 \\ 1 & 0 & 0 & 0 & 0 & 0 & 0 & 0 & 0 & 0 & 0 & 0 & 0 & 0 & 0 & 0 & 0 & 0 \\ 0 & 1 & 0 & 0 & 0 & 0 & 0 & 0 & 0 & 0 & 0 & 0 & 0 & 0 & 0 & 0 & 0 & 0 \\ 0 & 0 & 1 & 0 & 0 & 0 & 0 & 0 & 0 & 0 & 0 & 0 & 0 & 0 & 0 & 0 & 0 & 0 \\ 0 & 0 & 0 & 1 & 0 & 0 & 0 & 0 & 0 & 0 & 0 & 0 & 0 & 0 & 0 & 0 & 0 & 0 \\ 0 & 0 & 0 & 0 & 1 & 0 & 0 & 0 & 0 & 0 & 0 & 0 & 0 & 0 & 0 & 0 & 0 & 0 \\ 0 & 0 & 0 & 0 & 0 & 1 & 0 & 0 & 0 & 0 & 0 & 0 & 0 & 0 & 0 & 0 & 0 & 0 \\ 0 & 0 & 0 & 0 & 0 & 0 & 1 & 0 & 0 & 0 & 0 & 0 & 0 & 0 & 0 & 0 & 0 & 0 \\ 0 & 0 & 0 & 0 & 0 & 0 & 0 & 1 & 0 & 0 & 0 & 0 & 0 & 0 & 0 & 0 & 0 & 0 \\ 0 & 0 & 0 & 0 & 0 & 0 & 0 & 0 & 1 & 0 & 0 & 0 & 0 & 0 & 0 & 0 & 0 & 0 \\ 0 & 0 & 0 & 0 & 0 & 0 & 0 & 0 & 0 & 1 & 0 & 0 & 0 & 0 & 0 & 0 & 0 & 0 \\ 0 & 0 & 0 & 0 & 0 & 0 & 0 & 0 & 0 & 0 & 1 & 0 & 0 & 0 & 0 & 0 & 0 & 0 \\ 0 & 0 & 0 & 0 & 0 & 0 & 0 & 0 & 0 & 0 & 0 & 1 & 0 & 0 & 0 & 0 & 0 & 0 \\ 0 & 0 & 0 & 0 & 0 & 0 & 0 & 0 & 0 & 0 & 0 & 0 & 1 & 0 & 0 & 0 & 0 & 0 \\ 0 & 0 & 0 & 0 & 0 & 0 & 0 & 0 & 0 & 0 & 0 & 0 & 0 & 1 & 0 & 0 & 0 & 0 \\ 0 & 0 & 0 & 0 & 0 & 0 & 0 & 0 & 0 & 0 & 0 & 0 & 0 & 0 & 1 & 0 & 0 & 0 \\ 0 & 0 & 0 & 0 & 0 & 0 & 0 & 0 & 0 & 0 & 0 & 0 & 0 & 0 & 0 & 1 & 0 & 0 \\ 0 & 0 & 0 & 0 & 0 & 0 & 0 & 0 & 0 & 0 & 0 & 0 & 0 & 0 & 0 & 0 & 1 & 0 \end{vmatrix}$$

Furthermore, the vector operation coefficient $P(8)$ when the amount of the phase shift is 8 is represented by use of the vector operation coefficient $P(1)$ as:

$P(8)=P(1) \cdot P(1) \cdot P(1) \cdot P(1) \cdot P(1) \cdot P(1) \cdot P(1) \cdot P(1)$ Specific computing of the vector operation coefficient $P(8)$ using this relation results in:

$$\begin{vmatrix} 0 & 0 & 0 & 1 & 0 & 0 & 0 & 0 & 0 & 1 & 0 & 0 & 0 & 0 & 0 & 0 & 0 & 0 \\ 0 & 0 & 0 & 0 & 1 & 0 & 0 & 0 & 0 & 0 & 1 & 0 & 0 & 0 & 0 & 0 & 0 & 0 \\ 0 & 0 & 0 & 0 & 0 & 1 & 0 & 0 & 0 & 0 & 0 & 1 & 0 & 0 & 0 & 0 & 0 & 0 \\ 0 & 0 & 0 & 0 & 0 & 0 & 1 & 0 & 0 & 0 & 0 & 0 & 1 & 0 & 0 & 0 & 0 & 0 \\ 0 & 0 & 0 & 0 & 0 & 0 & 0 & 1 & 0 & 0 & 0 & 0 & 0 & 1 & 0 & 0 & 0 & 0 \\ 0 & 0 & 0 & 0 & 0 & 0 & 0 & 0 & 1 & 0 & 0 & 0 & 0 & 0 & 1 & 0 & 0 & 0 \\ 0 & 0 & 0 & 0 & 0 & 0 & 0 & 0 & 0 & 1 & 0 & 0 & 0 & 0 & 0 & 1 & 0 & 0 \\ 0 & 0 & 0 & 0 & 0 & 0 & 0 & 0 & 0 & 0 & 1 & 0 & 0 & 0 & 0 & 0 & 1 & 0 \\ 0 & 0 & 0 & 0 & 0 & 0 & 0 & 0 & 0 & 0 & 0 & 1 & 0 & 0 & 0 & 0 & 0 & 1 \\ 1 & 0 & 0 & 0 & 0 & 0 & 0 & 0 & 0 & 0 & 0 & 0 & 0 & 0 & 0 & 0 & 0 & 0 \\ 0 & 1 & 0 & 0 & 0 & 0 & 0 & 0 & 0 & 0 & 0 & 0 & 0 & 0 & 0 & 0 & 0 & 0 \\ 0 & 0 & 1 & 0 & 0 & 0 & 0 & 0 & 0 & 0 & 0 & 0 & 0 & 0 & 0 & 0 & 0 & 0 \\ 0 & 0 & 0 & 1 & 0 & 0 & 0 & 0 & 0 & 0 & 0 & 0 & 0 & 0 & 0 & 0 & 0 & 0 \\ 0 & 0 & 0 & 0 & 1 & 0 & 0 & 0 & 0 & 0 & 0 & 0 & 0 & 0 & 0 & 0 & 0 & 0 \\ 0 & 0 & 0 & 0 & 0 & 1 & 0 & 0 & 0 & 0 & 0 & 0 & 0 & 0 & 0 & 0 & 0 & 0 \\ 0 & 0 & 0 & 0 & 0 & 0 & 1 & 0 & 0 & 0 & 0 & 0 & 0 & 0 & 0 & 0 & 0 & 0 \\ 0 & 0 & 0 & 0 & 0 & 0 & 0 & 1 & 0 & 0 & 0 & 0 & 0 & 0 & 0 & 0 & 0 & 0 \\ 0 & 0 & 0 & 0 & 0 & 0 & 0 & 0 & 1 & 0 & 0 & 0 & 0 & 0 & 0 & 0 & 0 & 0 \end{vmatrix}$$

Description is specifically made hereinbelow by way of example.

Let $C(n)$ be e.g., the M-sequence spreading code with its phase shifted by n steps from its initial state.

$$C(n) = \begin{vmatrix} 0 \\ 0 \\ 0 \\ 0 \\ 0 \\ 0 \\ 0 \\ 0 \\ 0 \\ 0 \\ 0 \\ 0 \\ 0 \\ 0 \\ 0 \\ 0 \\ 0 \\ 1 \end{vmatrix}$$

The topmost data is MSB and the bottommost data is LSB.

This $C(n)$ is multiplied by the vector operation coefficient $P(8)$ with the amount of phase shift of 8. Namely, the following operation is executed:

$C(n+8)=P(8) \cdot C(n)$

This operation is represented as:

$$\begin{vmatrix} 0 & 0 & 0 & 1 & 0 & 0 & 0 & 0 & 0 & 1 & 0 & 0 & 0 & 0 & 0 & 0 & 0 & 0 \\ 0 & 0 & 0 & 0 & 1 & 0 & 0 & 0 & 0 & 0 & 1 & 0 & 0 & 0 & 0 & 0 & 0 & 0 \\ 0 & 0 & 0 & 0 & 0 & 1 & 0 & 0 & 0 & 0 & 0 & 1 & 0 & 0 & 0 & 0 & 0 & 0 \\ 0 & 0 & 0 & 0 & 0 & 0 & 1 & 0 & 0 & 0 & 0 & 0 & 1 & 0 & 0 & 0 & 0 & 0 \\ 0 & 0 & 0 & 0 & 0 & 0 & 0 & 1 & 0 & 0 & 0 & 0 & 0 & 1 & 0 & 0 & 0 & 0 \\ 0 & 0 & 0 & 0 & 0 & 0 & 0 & 0 & 1 & 0 & 0 & 0 & 0 & 0 & 1 & 0 & 0 & 0 \\ 0 & 0 & 0 & 0 & 0 & 0 & 0 & 0 & 0 & 1 & 0 & 0 & 0 & 0 & 0 & 1 & 0 & 0 \\ 0 & 0 & 0 & 0 & 0 & 0 & 0 & 0 & 0 & 0 & 1 & 0 & 0 & 0 & 0 & 0 & 1 & 1 \\ = 1 & 0 & 0 & 0 & 0 & 0 & 0 & 0 & 0 & 0 & 0 & 0 & 0 & 0 & 0 & 0 & 0 & 0 \\ 0 & 1 & 0 & 0 & 0 & 0 & 0 & 0 & 0 & 0 & 0 & 0 & 0 & 0 & 0 & 0 & 0 & 0 \\ 0 & 0 & 1 & 0 & 0 & 0 & 0 & 0 & 0 & 0 & 0 & 0 & 0 & 0 & 0 & 0 & 0 & 0 \\ 0 & 0 & 0 & 1 & 0 & 0 & 0 & 0 & 0 & 0 & 0 & 0 & 0 & 0 & 0 & 0 & 0 & 0 \\ 0 & 0 & 0 & 0 & 1 & 0 & 0 & 0 & 0 & 0 & 0 & 0 & 0 & 0 & 0 & 0 & 0 & 0 \\ 0 & 0 & 0 & 0 & 0 & 1 & 0 & 0 & 0 & 0 & 0 & 0 & 0 & 0 & 0 & 0 & 0 & 0 \\ 0 & 0 & 0 & 0 & 0 & 0 & 1 & 0 & 0 & 0 & 0 & 0 & 0 & 0 & 0 & 0 & 0 & 0 \\ 0 & 0 & 0 & 0 & 0 & 0 & 1 & 0 & 0 & 0 & 0 & 0 & 0 & 0 & 0 & 0 & 0 & 0 \end{vmatrix} \cdot \begin{vmatrix} 0 \\ 0 \\ 0 \\ 0 \\ 0 \\ 0 \\ 0 \\ 0 \\ 0 \\ 0 \\ 0 \\ 0 \\ 0 \\ 0 \\ 0 \\ 0 \\ 0 \\ 0 \end{vmatrix}$$

-continued

|0 0 0 0 0 0 0 1 0 0 0 0 0 0 0 0 0 0| |0|

|0 0 0 0 0 0 0 0 1 0 0 0 0 0 0 0 0 0| |0|

|0 0 0 0 0 0 0 0 0 1 0 0 0 0 0 0 0 0| |1|

As a result of the above operation, C(n+8) is expressed as:

$$C(n+8) = \begin{vmatrix} 0 \\ 0 \\ 0 \\ 0 \\ 0 \\ 0 \\ 0 \\ 1 \\ 0 \\ 0 \\ 0 \\ 0 \\ 0 \\ 0 \\ 0 \\ 0 \\ 0 \\ 0 \end{vmatrix}$$

Figures 6A, 6B:
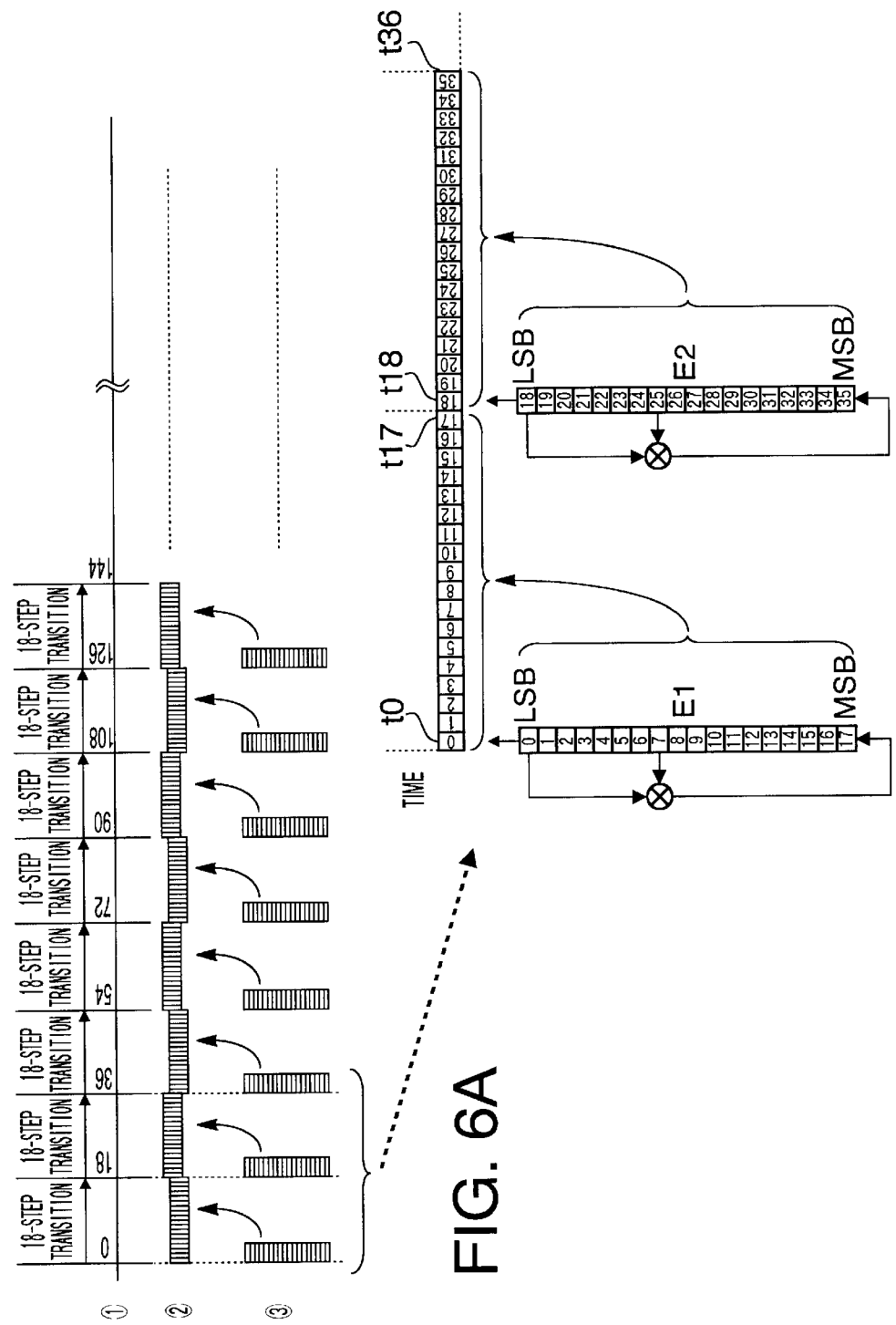
FIG. 6A is an illustration for explaining a principle based on which the spreading code generating circuit according to the first embodiment generates spreading codes in series by a vector operation.
FIG. 6B is an illustration for more specifically explaining a principle based on which the spreading code generating circuit according to the first embodiment generates spreading codes in series by the vector operation.

Reference is then made to FIGS. 6A and 6B to describe a method of providing parallel, successive output of cyclic spreading codes by use of the vector operation.

The topmost (numbered by ①) of FIG. 6A depicts the spreading code bit count on an 18-bit basis on the time axis.

The second topmost (numbered by ②) of FIG. 6A depicts the M-sequence spreading codes output in series for each step shift of the bit circulative shift register.

The bottommost (numbered by ③) of FIG. 6A depicts 18-bit data output in parallel from the shift register when the shift register retaining data is shifted in succession on an 18-step basis.

The equivalent relationship lies between the generation of the spreading codes as a result of bit-by-bit serial output of 18-bit data stored in the bit circulative shift register and the generation of the spreading codes as a result of parallel output of 18-bit data stored in the bit circulative shift register.

Numerals in blocks of FIG. 6B number bits generated by the bit circulative shift register in its initial state. For example, 2 denotes the second bit from LSB.

As seen in the lower left of FIG. 6B, the equivalent relationship lies between the parallel output at t0 of data at $0^{th}$ bit to $17^{th}$ bit from the LSV of the bit circulative shift register and the bit-by-bit serial output over t0 to t17.

Similarly, as seen in the lower right of FIG. 6B, the equivalent relationship lies between the parallel output at t18 of data at $18^{th}$ bit to $35^{th}$ bit from the LSB of the bit circulative shift register and the bit-by-bit serial output over t18 to t36.

From this viewpoint, in the present invention, each of data held in the shift register is multiplied by a vector operation coefficient, to impart thereto a phase shift of the number of steps corresponding to the number of taps of the shift register.

Furthermore, data is in parallel output from the shift register. Successive execution of this operation allows an extremely rapid generation of successive spreading codes.

In fact, six different vector operation coefficients are used so that desirable phase shifts can be imparted to the spreading codes.

FIG. 7A is an 18-bit (a00 to a17) binary representation of any amount of phase shift.

FIG. 7B shows the contents of the vector operation effected to provide the phase shift of the FIG. 7A data.

In FIG. 7B, A denotes a vector operation coefficient for phase shifting the bit circulative shift register data by 1 step.

Through repeated multiplication of the vector operation coefficient A for one-step phase shifting, the phase can be shifted by a desired number of steps. This results in a generation of data with an arbitrary phase.

The vector operation for providing a desired phase shifting can be implemented by combining six different vector operation coefficients, $A^{(2^{15})}$, $A^{(2^{12})}$, $A^{(2^{9})}$, $A^{(2^{6})}$, $A^{(2^{3})}$ and $A^{(2^{0})}$, as shown in FIG. 7B.

Figure 17A:
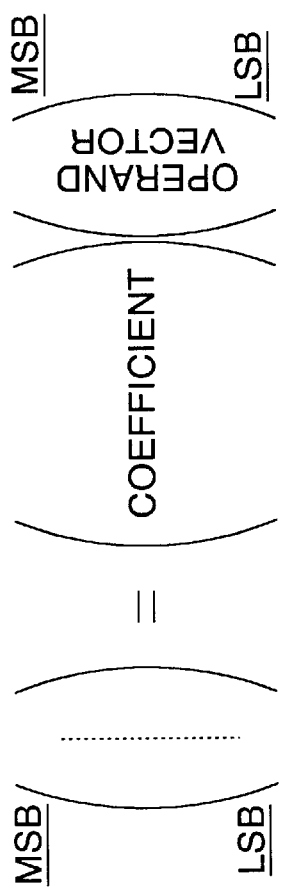
FIG. 17A is an illustration showing a basic form of a vector multiplication.
Figure 17B:
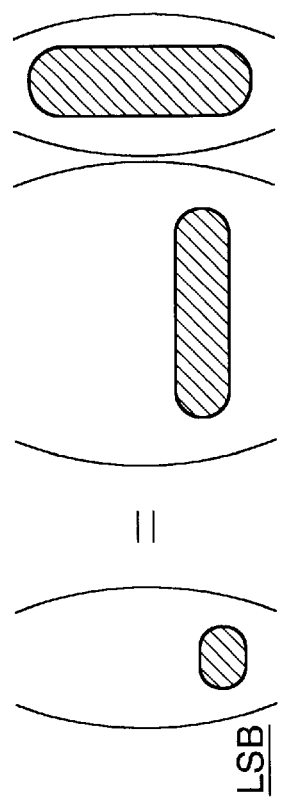
FIG. 17B is an illustration showing the contents of a conventional vector multiplication.

Referring then to FIGS. 17A, 17B and 18, description will be made of the difference between the phase-shifted data generation method using the vector operation of this embodiment and the conventional vector multiplication based method.

As shown in FIG. 17A, the vector operation is executed by multiplying an operand vector by a vector multiplication coefficient (designated simply as coefficient in FIG. 17A).

Hitherto known vector operation based data phase shifting is effected by calculation of "1-bit" data (LSB) phase shifted by a predetermined number of steps, as shown in FIG. 17B.

Figure 17C:
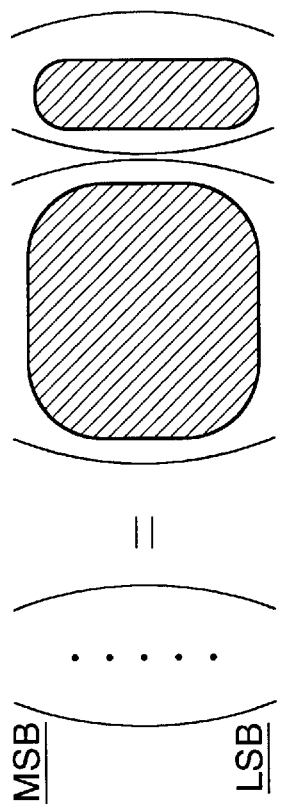
FIG. 17C is an illustration showing the contents of a vector multiplication according to the present invention.

On the contrary, in the present invention, as shown in FIG. 17C, values of data "from MSB TO LSB" of the shift register are found posterior to phase shifting by a predetermined number of steps in accordance with the spreading code generator polynomial.

That is, computing is made of all phase-shifted data held by the bit circulative shift register. This basically differs in conception from the prior art. Quite different vector operation coefficients are thus used.

FIG. 18 shows characteristics of the present invention in contrast with the prior art.

In the prior art, the phase shifting is effected by a desired number of steps using the vector operation. The successive output of the successive spreading codes is effected by use of the bit circulative shift register. That is, the phase shifting is completely distinguished from the cyclic code generation.

In contrast, in the case of the present invention, the vector operation is used to achieve both the phase shifting corresponding to a desired number of steps and the successive output of the successive spreading code. That is, the present invention has no distinction between the former and the latter because of the simultaneous execution thereof.

In this manner, the basic concept of the present invention is basically different from that of the prior art.

Figure 8:
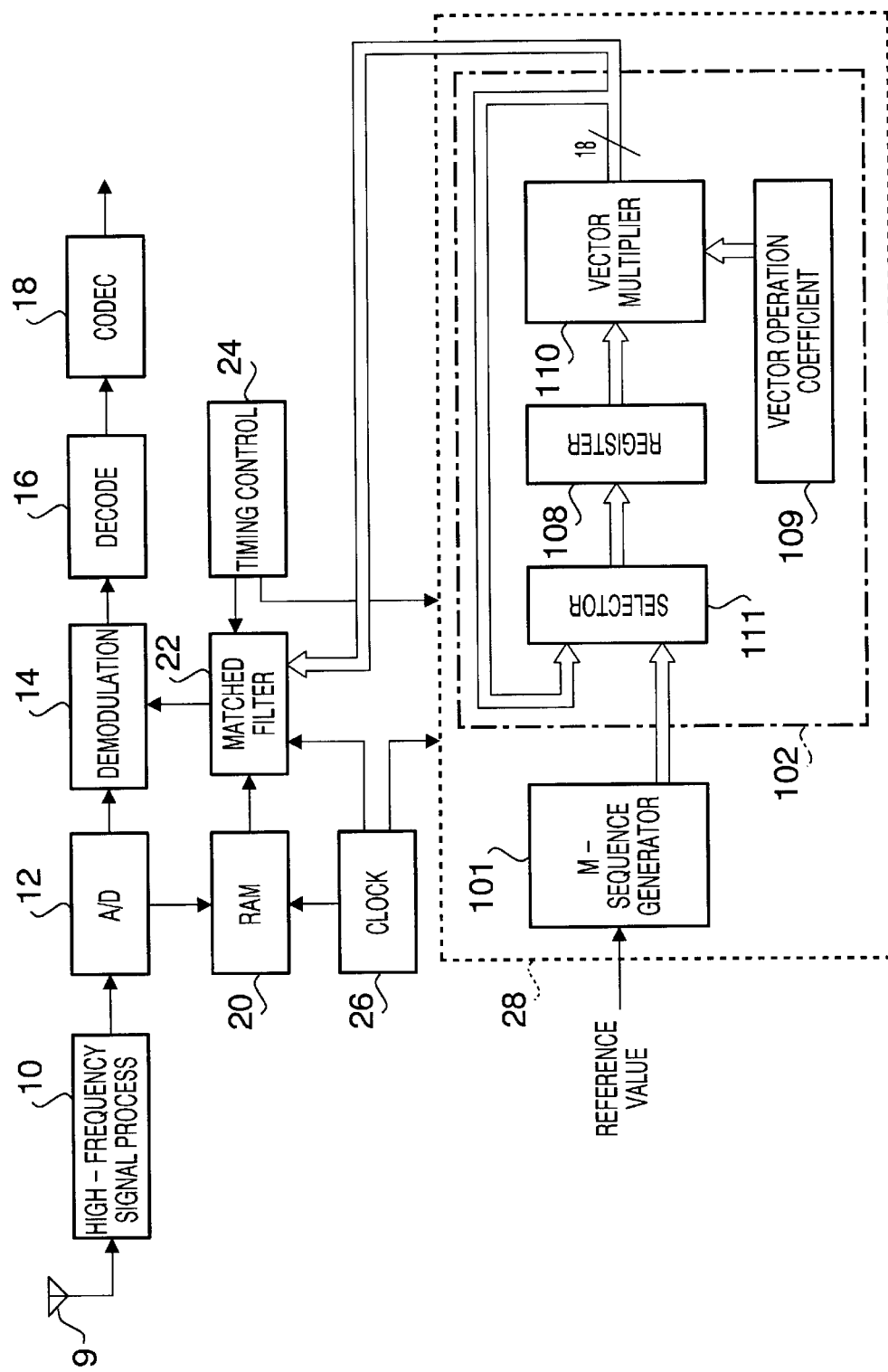
FIG. 8 is a block diagram showing a configuration of a CDMA receiver incorporating the spreading code generating circuit according to the first embodiment.

FIG. 8 is a block diagram showing a major configuration of a CDMA receiver employing the spreading code generating circuit of the present invention.

This receiver comprises a reception antenna 9, a high-frequency signal processing unit 10 for filtering and amplification at a predetermined frequency, an A/D converter 12, a demodulator 14, a decoder 16, a CODEC unit 18 for converting a decoded signal into a speech, a RAM 20, a matched filter 22, a timing control circuit 24, a clock generator 26, and a spreading code generating circuit 28.

A spectrum spreading reception signal is temporarily stored in the RAM 20 and thereafter is set in the matched filter 22.

18-bit spreading codes are in parallel and in succession generated from the spreading code generating circuit 28.

Correlation values are then acquired by multiplying the reception data set in the matched filter 22 by the spreading codes.

The circuit of FIG. 8 generates 18-bit spreading codes in parallel and in succession. A significant speedup is thus achieved in spreading code generation as compared with the prior art. This leads to a shortening of time taken for the acquisition of the initial synchronization in the CDMA communication. A rapid synchronism complementing is also achieved.

Furthermore, in the present invention, the spreading codes are provided as parallel output. This eliminates the need for a circuit (serial/parallel conversion circuit) arranged to convert data output serially from the bit circulative shift register into a parallel form for the input to the matched filter as needed in the prior art.

Due to its rapid generation capability overcoming the prior art there is no need for the parallel operation of a plurality of spreading code generating circuits. The reduction in circuit scale and power consumption is thus achieved.

Embodiment 2

Figure 9:
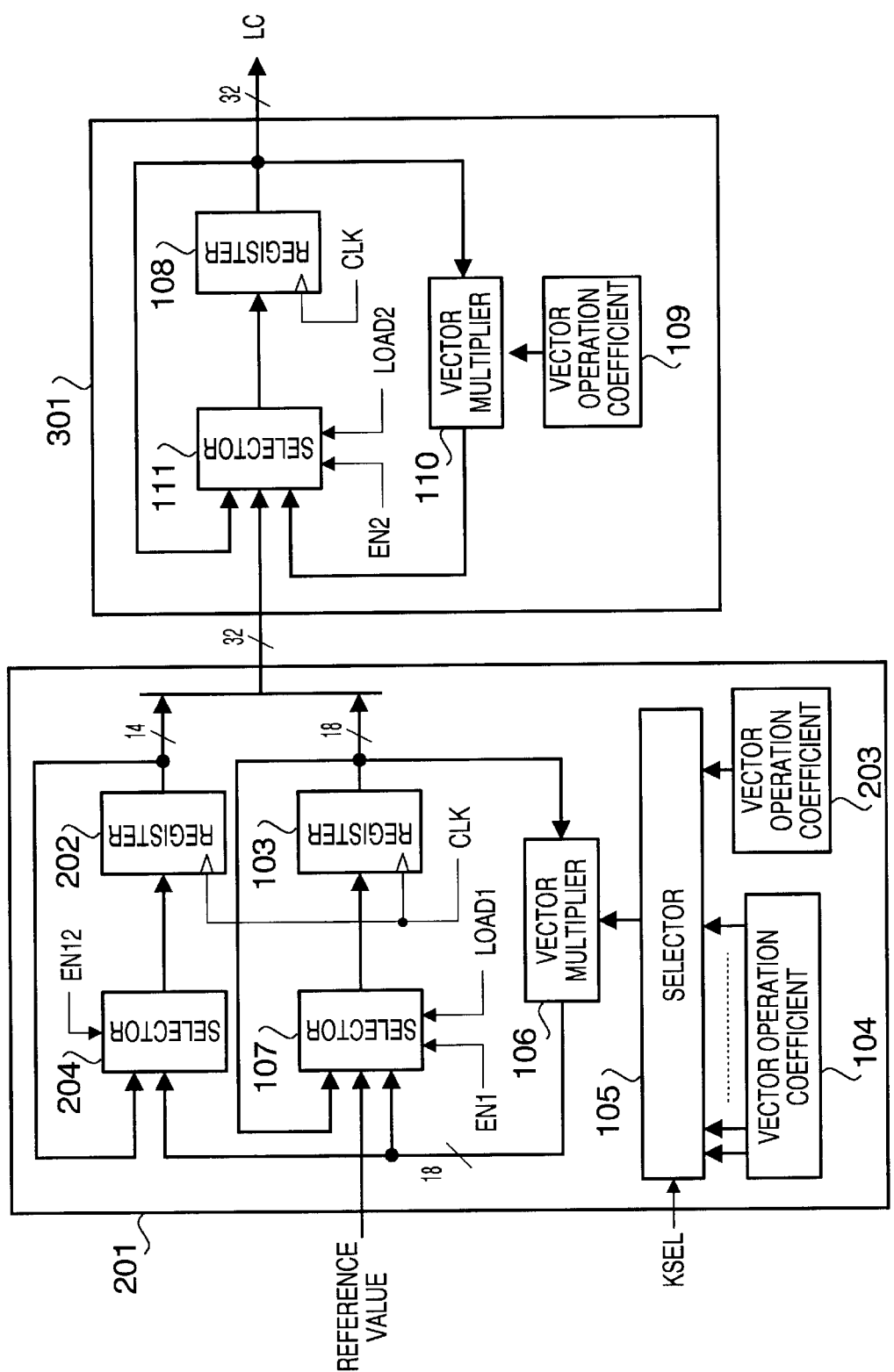
FIG. 9 is a block diagram showing a configuration of a spreading code generating circuit according to a second embodiment.

FIG. 9 is a block diagram showing a configuration of a spreading code generating circuit according to a second embodiment of the present invention.

The basic operations of the circuit of this embodiment are substantially the same as those of the circuit of FIG. 5.

However, this embodiment is different therefrom in that an initial value generation circuit 201 has a bit extension function.

A 18-bit reference value is imparted to the initial value generation circuit 201. The initial value generation circuit 201 is able to form a 32-bit initial value from the 18-bit reference value. That is, 14 bits are additionally acquired.

The extended 32-bit initial value is fed to the circular shift operation circuit 102 having a configuration capable of 32-bit parallel processing.

The initial value generation circuit 201 of FIG. 9 has such a configuration that a register 202 and a selector 204 are added to the initial value generation circuit 101 shown in FIG. 5.

The initial value generation circuit 201 comprises the vector operation coefficient output circuit 104 as well as a vector operation coefficient output circuit 203 for generating a bit extending vector operation coefficient.

The vector operation coefficient output circuit 104 provides as its output the vector operation coefficient for phase shifting the reference values.

Figure 10:
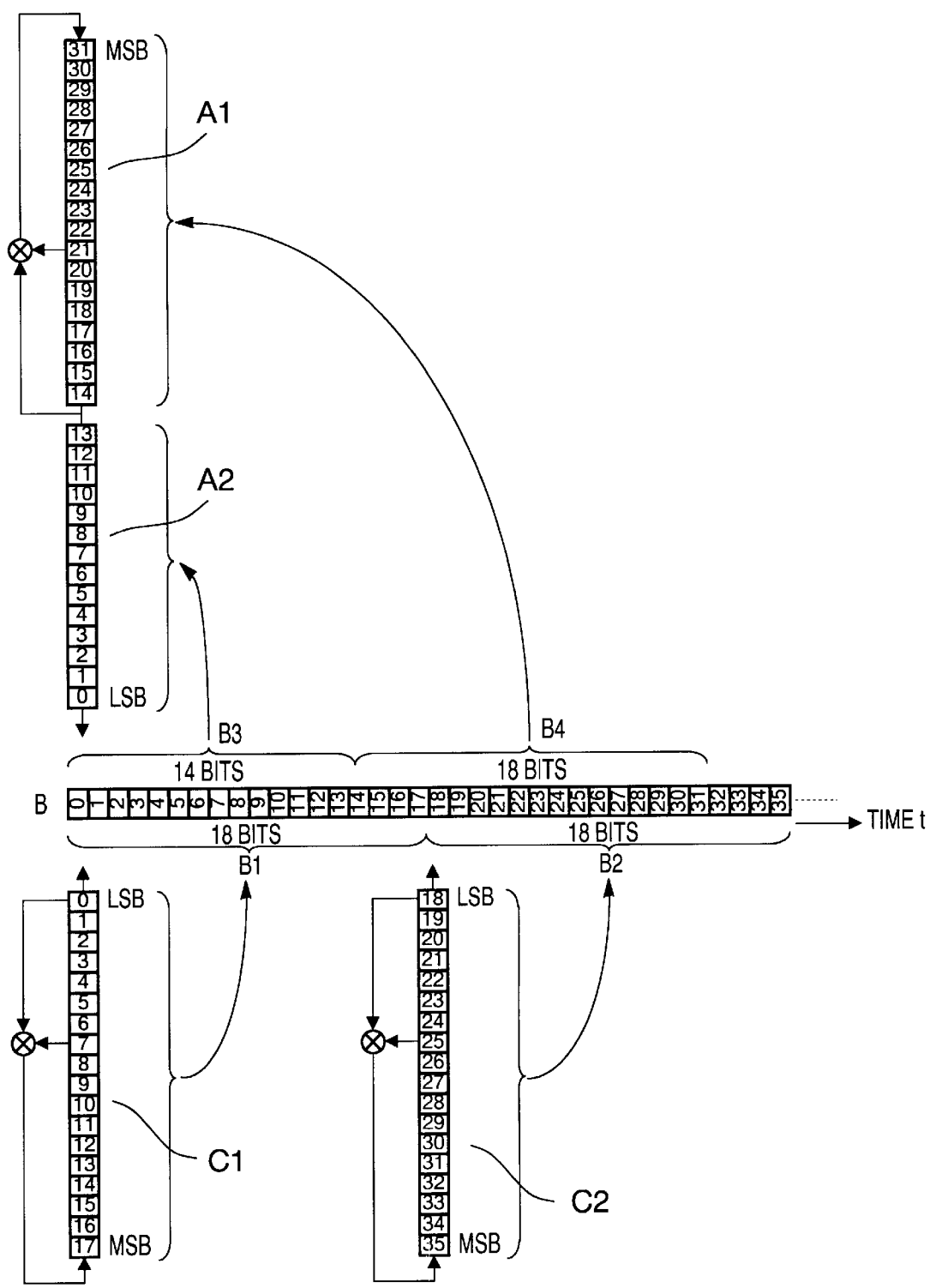
FIG. 10 is an illustration for explaining a bit width extension operation of an M-sequence initial value in the spreading code generating circuit of the second embodiment.

FIG. 10 is an illustration showing the principle of bit extension in the initial value generation circuit.

The initial value generation circuit 201 of this embodiment serves to extend the initial value from 18 bits to 32 bits.

FIG. 10 shows a 32-bit shift register (A1+A2).

This 32-bit shift register comprises a 18-bit bit circulative shift register A1 and a typical 14-bit shift register A2. This allows the 18-bit bit circulative shift register to generate 32-bit spreading codes.

The data held in the bit circulative shift register A1 corresponds to 18-bit data B4 on the time axis. The data held in the shift register A2 corresponds to 14-bit data B3.

The 32-bit data composed of data B3 and B4 can be created by deleting 4 bits from the 36-bit data composed of data B1 and B2.

In other words, the data B1 is generated by a 18-bit bit circulative shift register C1 whilst the data B2 is generated by a 18-bit bit circulative shift register C2 so that the data B1 and B2 are added together to obtain data of 36 bits in total.

Deletion of upper 4 bits from the 37-bit data results in 14-bit data B3 and 18-bit data B4.

It will be appreciated from the above description that extended data is obtained by executing two-stage shifting that includes the initial value generation shift and the bit extension shift and adding up the data generated as a result of those shifts.

From such a conception, the FIG. 9 circuit fist executes the same operations as the initiation value generation circuit 101 of FIG. 5 so that externally input 18-bit reference value is shifted by a desired phase, with the result being placed in the register 103.

The data placed in the register 103 is further multiplied by the bit extending vector operation coefficient to generate extended bits, with the thus generated extended data being placed in the register 202.

The extended bits (a total of 14 bits with unnecessary bits discarded) are then added to 18 bits obtained as a result of phase shifting of the reference value (held in the register 202) to obtain a spreading code initial value (32-bit).

The 32-bit initial value is fed to the circular shift operation circuit 102 having a 32-bit configuration.

As described in the above embodiment, plural-bit spreading codes are successively generated in parallel, with the data cycled.

The 32-bit M-sequence spreading code generator a polynomial is given as $X^{32}+X^{21}+X^{14}$, which is obtained by increasing by 14 the degree of the above-described 18-bit generator polynomial $X^{18}+X^{7}+1$.

Thus, the vector operation coefficient output circuit 109 in the 32-bit circular shift operation circuit 102 provides as its output a vector operation coefficient for 32-step shifting based on the generator polynomial in 32-bit configuration.

The manner of acquiring the vector operation coefficient for 32-step phase shifting is essentially the same as the case of the 18-step phase shifting vector operation coefficient as set forth hereinabove.

In this manner, by virtue of the bit extension feature possessed by the initial value generation circuit, this embodiment allows the respective bit counts to be matched for easier connection between the initial value generation circuit 201 and the spreading code generating circuit 102 that have different bit configurations.

The FIG. 10 circuit can also reduce the circuit scale of the initial value generation circuit, as compared with the case where the 32-bit initial value generation circuit is initially mounted. Thus, in case of integrating this circuit, the chip area can be reduced, which is advantageous in terms of the miniaturization of ICs.

Embodiment 3

Figure 11:
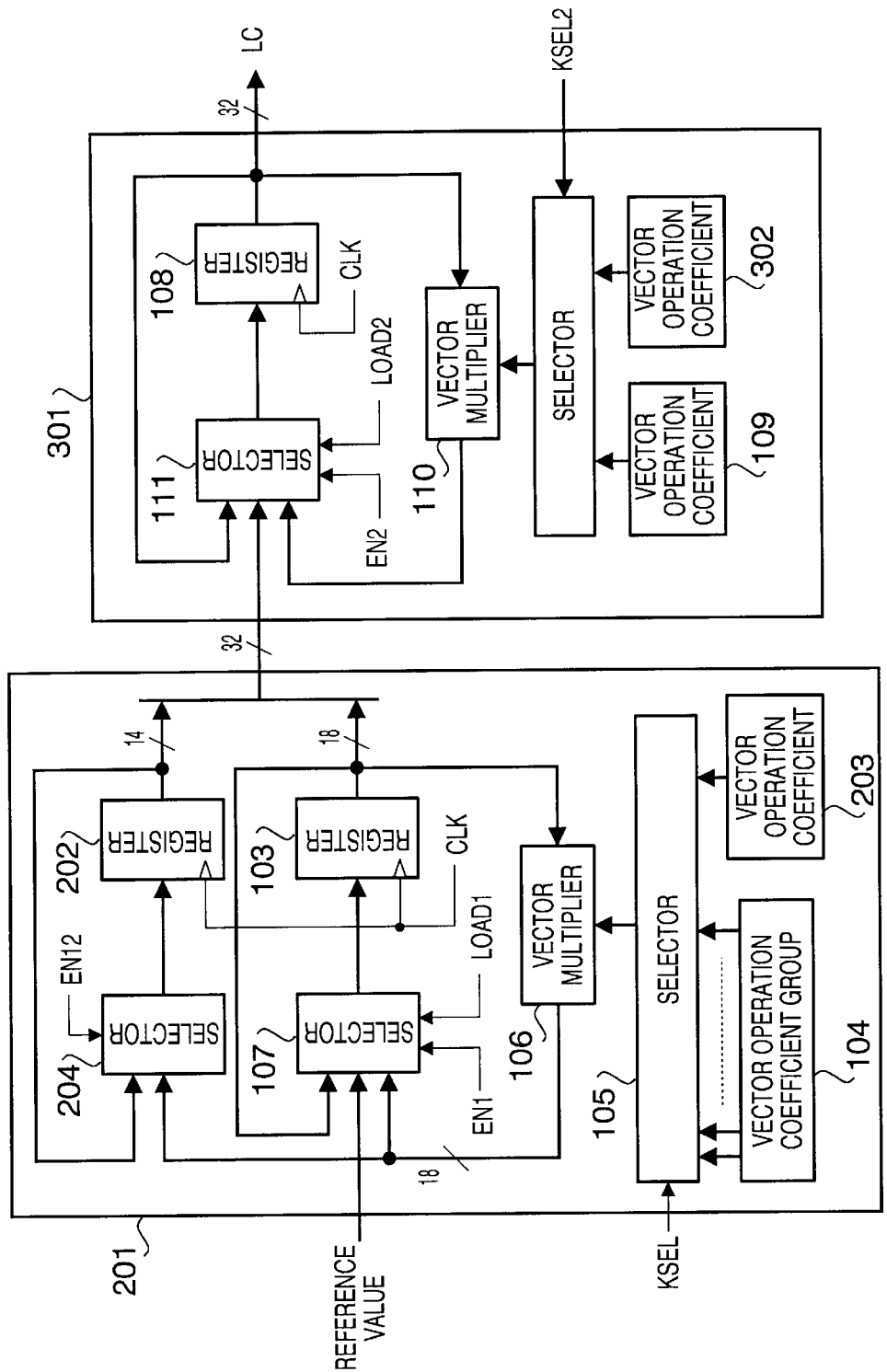
FIG. 11 is a block diagram showing a configuration of a spreading code generating circuit according to a third embodiment.

FIG. 11 is a block diagram showing a spreading code generating circuit according to a third embodiment of the present invention.

The basic configuration is substantially the same as that of the FIG. 8 circuit (second embodiment), except that a circular shift operation circuit 301 of this embodiment comprises a vector operation coefficient output circuit 302 which provides as its output a vector operation coefficient for shifting at a stretch from the trailing edge of one spreading code up to the leading edge of a spreading code to next be generated.

Figure 12:
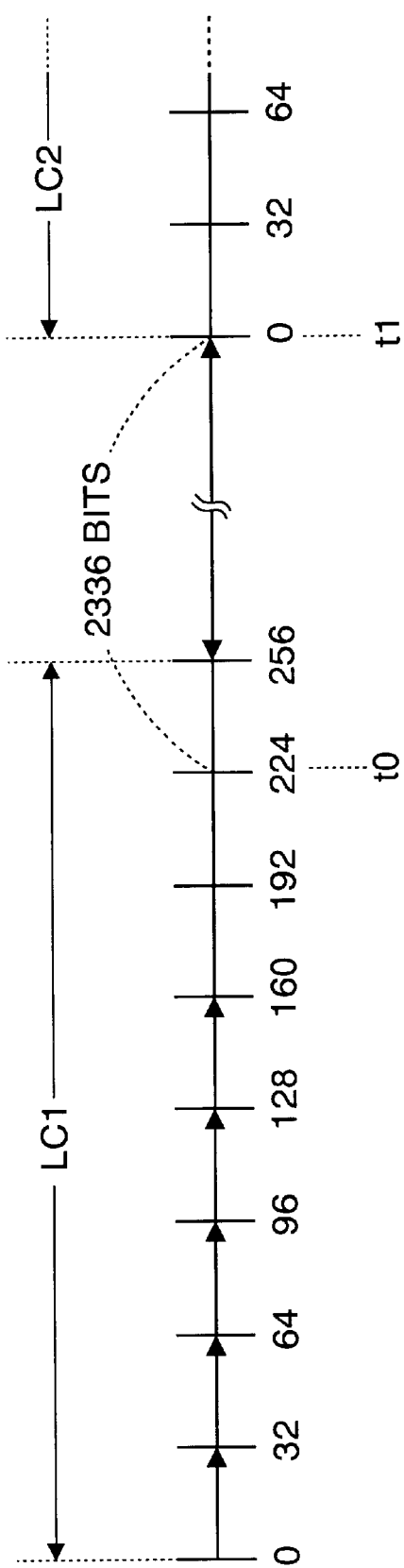
FIG. 12 is an illustration for explaining a method of generating different spreading codes in succession in the third embodiment.

In FIG. 12, generation of a 256-bit spreading code LC1 terminates at t0. Then, each tap data held in a register is phase shifted at a stretch by 2336 bits (by 256 steps) through the vector operation using the vector operation coefficient 302.

Leading 32 bits of the next spreading code L2 are output at time t1 (next clock timing).

This enables the next spreading code to be generated at the next clock immediately after the completion of generation of the single spreading code. Thus, unlike the prior art there is no need for useless cycling of the bit circulative shift register.

Upon the termination of generation of one spreading code by the spreading code generating circuit 301 of FIG. 11, the selector 105 makes a selection of the vector operation coefficients (which provide the amount of shift for shifting at a stretch to the leading edge of the next spreading code) output from the vector operation coefficient output circuit 302.

Embodiment 4

Figure 13:
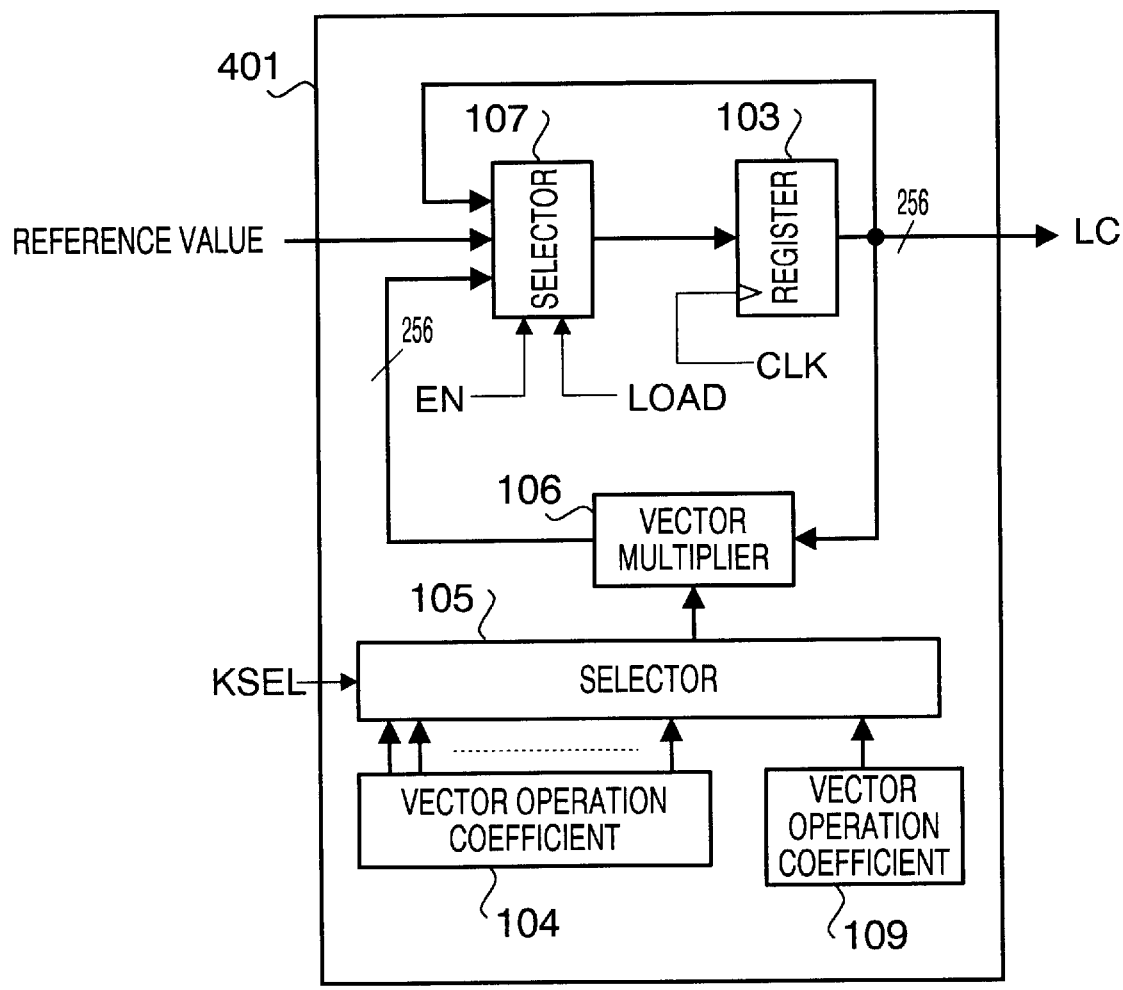
FIG. 13 is a block diagram showing a configuration of a spreading code generating circuit according to a fourth embodiment.

FIG. 13 is a block diagram showing a spreading code generating circuit according to a fourth embodiment of the present invention.

The circuit of this embodiment is basically the same as the circuit of FIG. 5 in terms of functions.

In the FIG. 5 circuit the initial value generation circuit and the circular shift operation circuit are separately provided, whereas in the circuit of this embodiment the two circuits are integrated together.

The initial value generation circuit and the circular shift operation circuit both have the selector, the register and the vector multiplier. In other words, they have a common structure.

Hence, any sharing of the common structure of the two circuits to form an integral circuit would pose no problems.

The circuits are thus integrated with each other to achieve a further reduction in circuit scale and power consumption.

The circuit of FIG. 13 is able to provide a parallel output of an 256-bit spreading code LC.

In this embodiment, a vector operation coefficient for generation of the initial value is fed from the vector operation coefficient output circuit 104.

A vector operation coefficient for successive generation of the spreading codes is fed from the vector operation coefficient output circuit 109. Such a selection of the vector operation coefficient is effected by the selector 105.

It will not be so difficult to acquire the 256-bit vector operation coefficient from the 18-bit generator polynomial. In other words, it will suffice to perform the same processing as the case of data extension from 18 bits to 32 bits as discussed hereinabove.

Assume that a 238-bit shift register is added to a 18-bit bit circulative shift register. The degree of the generator polynomial is increased by 238. The generator polynomial $X^{18}+X^7+1$ can be represented as a 256-bit generator polynomial $X^{256}+X^{245}+X^{238}$.

Similar to the case of 18 bits, it is then possible to acquire the 256-bit vector operation coefficient.

Embodiment 5

Figure 14:
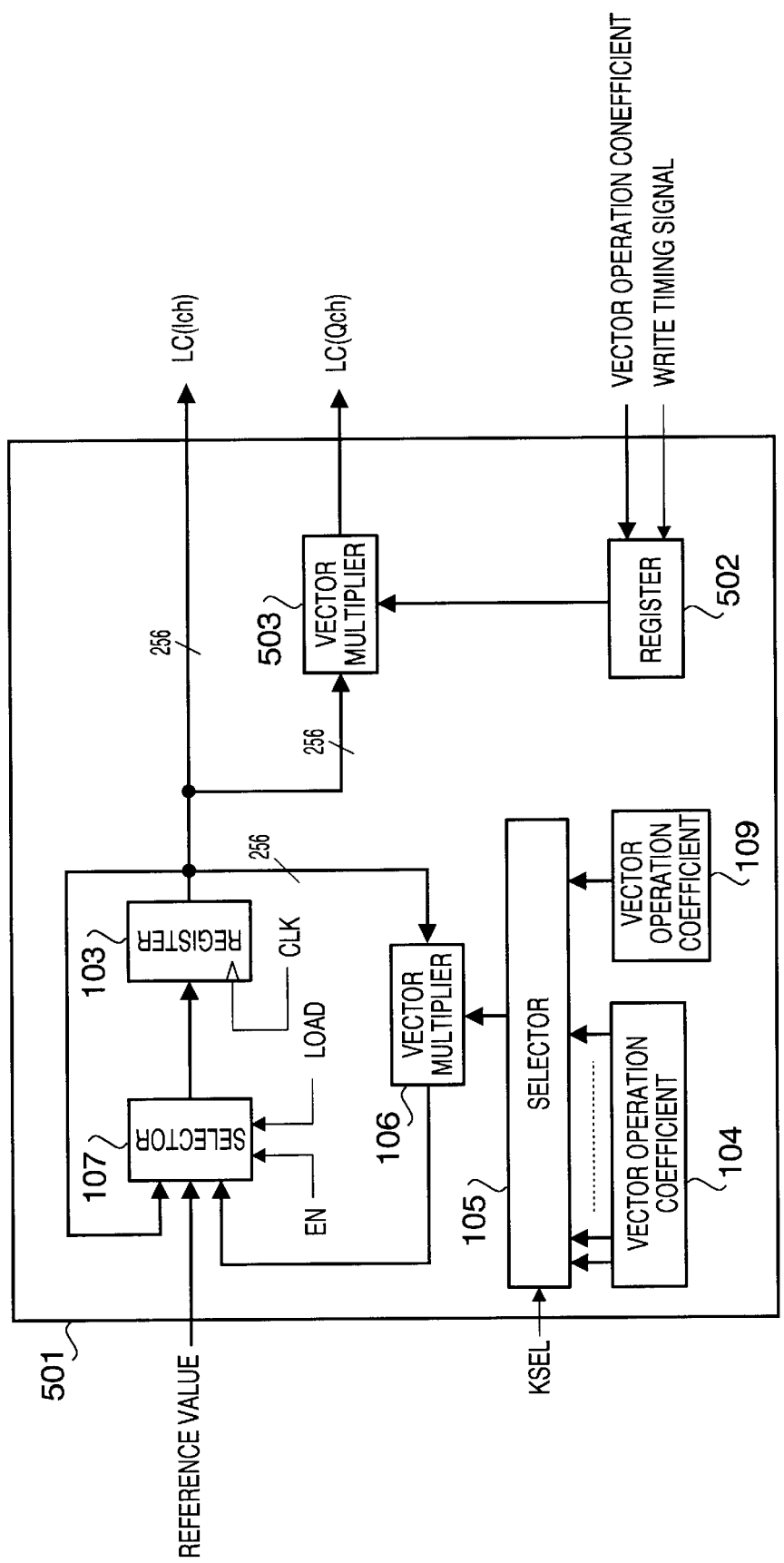
FIG. 14 is a block diagram showing a configuration of a spreading code generating circuit according to a fifth embodiment.

FIG. 14 is a block diagram of a spreading code generating circuit according to a fifth embodiment of the present invention.

In this embodiment, a register 502 and a vector multiplier 503 are disposed at the final stage of the circuit of FIG. 13. Simultaneous generation is thereby feasible of spreading codes for Q components (quadrature components) of QPSK (4-phase phase modulation) signals and spreading codes for I components (in-phase components).

The spreading codes for the I components are thus generated by use of the circuit of FIG. 13. The generated spreading codes are then subjected to a vector multiplication by the vector multiplier 503. The phase is thereby shifted by a predetermined number of steps, and the spreading codes for the Q components are generated. The I-component spreading codes and the Q-component spreading codes are provided as parallel output.

A Q component generating vector operation coefficient may be generated by a dedicated circuit. This embodiment however employs such a configuration that any required vector operation coefficient is generated externally and is registered in a register 502. This provides a more flexibility of operation.

Incidentally, the vector operation coefficient is fetched into the register 502 in synchronism with a write timing signal.

According to this embodiment, the I-component spreading codes are again shifted by the vector multiplier 503 to generate the Q-component spreading codes, so that it is possible to efficiently generate two series of spreading codes with a less number of circuits.

Embodiment 6

Figure 15:
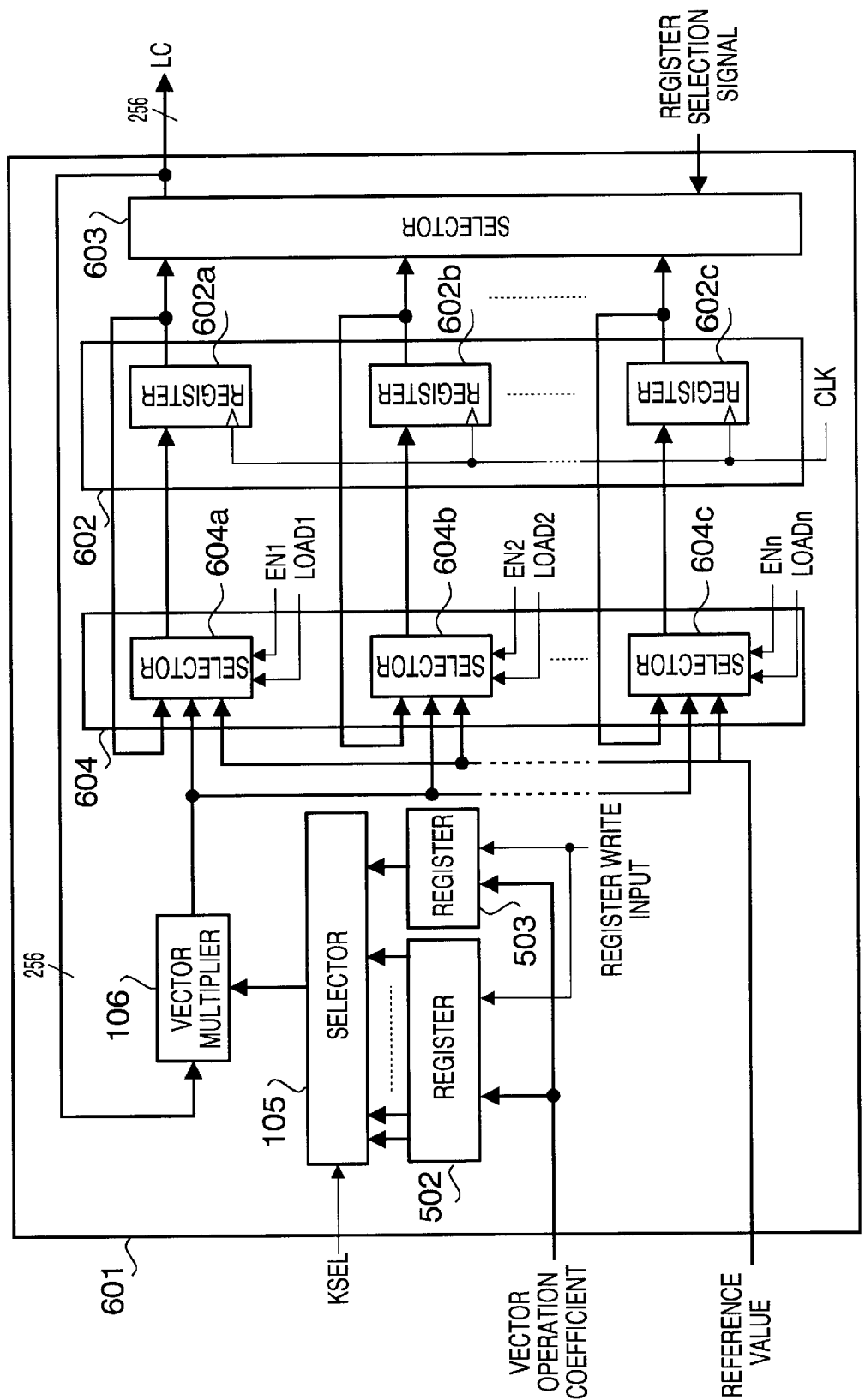
FIG. 15 is a block diagram showing a configuration of a spreading code generating circuit according to a sixth embodiment.

FIG. 15 is a block diagram showing a configuration of a spreading code generating circuit according to a sixth embodiment of the present invention.

The basic configuration and function of the circuit of this embodiment are substantially the same as the circuit of FIG. 13.

In this embodiment, as shown in FIG. 15, one multiplier 106 includes three resisters 602a to 602c and three selectors 604a to 604c.

More specifically, a loop for effecting a circular shift operation is branched in mid course so that appropriate selection can be made of which path to be used.

The circular shift operation includes the iteration of further shifting operations based on spreading codes once generated. Any data stored in the register is updated one after the other so that no hysteresis remains left.

However, there are some cases where a plurality of like spreading codes have to be generated. In such a case, a high-efficient generation of spreading codes would be achieved through the intact use of intermediate data of the previously generated spreading codes (i.e., data temporarily stored in the register in the process of successive generation of the spreading codes).

Thus, upon the generation of the most recent spreading code, the data stored in the register is saved without erasing it as a result of overwrite. The saved data is then used to generate the next spreading code.

From such a viewpoint, this embodiment includes a plurality of cyclic routes so as to allow the hysteresis of the circular shift operation to be saved. It is thus possible to avoid any overwrite to the register.

In mid course of the cyclic operation, the route to be used is determined depending on which of the selectors 604a to 604c fetches the output of the vector multiplier 106.

The selector 603 serves to select the output of any one of the registers 602a to 602c and feed it back to the vector multiplier 106.

Figure 16:
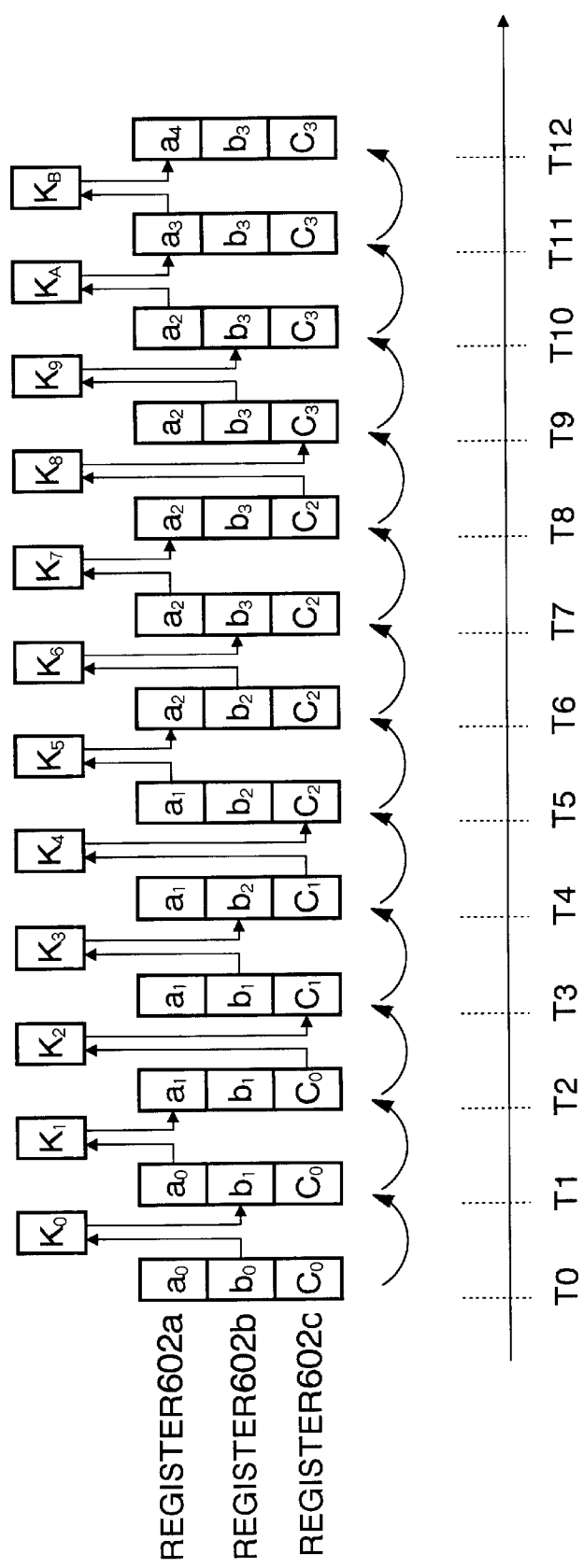
FIG. 16 is an illustration for explaining operations characteristic of the spreading code generating circuit according to the sixth embodiment.

FIG. 16 shows one example of actions in the case of saving the hysteresis in mid course of the circular shift operation.

Data a0, b0, c0 are held at time T0 in registers 602a to 602c, respectively.

The hold data b0 is multiplied by a vector operation coefficient k0, and the resultant data b1 is stored in the register 602b (time T1). The data in the registers 602a, 602c is intactly held without being overwritten. In other words, the hysteresis in mid course of the circular shift operation remains left.

The data a0 is then multiplied by a vector operation coefficient k1, and the resultant data a1 is held in the register 602a (time T2).

The data c0 is then multiplied by a vector operation coefficient k2, and the resultant data c1 is held in the register 602c (time T3).

In this manner, the register to be used is optionally switched while leaving the hysteresis in the process of the circular shift operation.

Although the present invention has been described hereinabove by way of the presently preferred embodiments, the present invention is not limited thereto and may variously be modified and adapted.

For example, the present invention is applicable widely to M-sequence code generation as well, without being limited to the spreading code generation.

According to the present invention, as set forth hereinabove, parallel, successive output of the spreading codes can be provided with any useless circuits eliminated.

The spreading code generation speed is thus markedly enhanced as compared with the prior art. This ensures, in an effective fashion, an earlier establishment of the reception synchronism or a rapid acquisition of synchronism, indispensable to the spreading spectrum communications.

It is also possible to achieve an improved speech quality in mobile communications. Due to its restricted circuit scale, reduction in space and power consumption is also attained. This is advantageous in miniaturizing ICs.

Furthermore, the present invention allows plural-bit spreading codes to be generated in parallel, so that markedly enhanced generation speed is achieved as compared with prior art using the serial generation.

By virtue of use of the vector operations presenting combined effects of capability of real-time phase shifting and of freely setting the amount of shift, there is achieved a high-speed and high-degree of freedom spreading code generation, which by no means has hitherto been obtained.

The present invention is not limited to the above described embodiments, and various variations and modifications may be possible without departing from the scope of the present invention.

This application is based on the Japanese Patent Application No.HEI11-048504 filed on Feb. 25, 1999, entire content of which is expressly incorporated by reference herein.

What is claimed is:

1. A spreading code generator comprising:
   a data buffer that inputs and outputs a plurality of bits in parallel; and
   a vector multiplier that performs a vector multiplication with each data bit output from the data buffer in parallel, in accordance with a spreading code generator polynomial, thereby executing, upon each data corresponding to a tap of circulative shift register that has a configuration in accordance with said spreading code generator polynomial, processing equivalent in effect to a shift corresponding, to the number of taps in said circulative shift register, and that provides said data buffer with a result of said multiplication;
   wherein said spread code generator successively generates a spreading code comprising the plurality of bits from said data buffer while circulating said plurality of bits in parallel.

2. A method of generating M-sequence codes using vector operations to perform processing substantially equivalent to a generation of M-sequence spreading codes expressed by a predetermined polynomial generator with a bit circulative shift register, the method comprising:
   multiplying each of a plurality of data bits output in parallel from a register, which is configured to enable a plurality of data bits to be input thereto and output therefrom in parallel, by a vector operation coefficient, thereby providing a predetermined amount of shift to each of the data bits; and
   setting in parallel the result of multiplication by the vector operation coefficient into the register,
   wherein a plurality of M-sequence codes are successively generated from the register while circulating the plurality of data bits in parallel.

3. The method of generating M-sequence codes according to claim 2, further comprising:
   multiplying, upon termination of generation of successive M-sequence codes, each of the data bits in the register by another vector operation coefficient to obtain a certain amount of bit shift, thereby obtaining a plurality of head data bits of next M-sequence codes.

4. A method of generating M-sequence codes using vector operations to perform processing substantially equivalent to a generation of M-sequence spreading codes expressed by a predetermined polynomial generator with a bit circulative shift register having n storage elements, where n is a natural number except 1, the method comprising:
   outputting in parallel n data bits corresponding to n data pieces held in each of the n storage elements of the bit circulative shift register in a first state, from a storage;
   multiplying each data bit corresponding to each data piece held in each storage element of the bit circulative shift register in the first state by a vector operation coefficient for n-step shifting to generate n data bits corresponding to each data piece held in each storage element of the bit circulative shift register to form a second state, and outputting each data piece obtained as the result of the multiplying operation in parallel from the storage; and
   multiplying each data bit corresponding to each data piece held in each storage element of the bit circulative shift register in the second state by a vector operation coefficient for n-step shifting to generate n data bits corresponding to each data piece held in each storage element of the bit circulative shift register to form a third state, and outputting each data piece obtained as a result of the multiplication in parallel from the storage circuit.

5. A spreading code generator using vector operations to perform processing substantially equivalent to generation, with a bit circulative shift register, of M-sequence spreading codes expressed by a predetermined generator polynomial, said bit circulative shift register having n storage elements, where n is a natural number except 1, said spreading code generator comprising;

a register, having n storage elements that enable n data bits to be input thereto and output therefrom in parallel;

an initial value generator that generates an initial value of said register and outputs generated n data bits in parallel;

a vector multiplier that multiplies each of the n data bits output in parallel from said register by a vector operation coefficient that imparts to each bit an amount of shift corresponding to n bits in said bit circulative shift register, and that outputs n data bits obtained as a result of multiplication in parallel; and a selector that selects one of a parallel output of n bits from said vector multiplier and a parallel output of n bits from said initial value generator to input to said register.

6. The spreading code generator according to claim 5, wherein said initial value generator includes:

a register having n storage elements that enable n data bits to be input thereto and output therefrom in parallel;

a vector multiplier that multiplies each bit of n data bits output in parallel from said register by a vector operation coefficient that imparts an amount of shift corresponding to the number of bits in said bit circulative shift register, and that outputs n data bits obtained as a result of said multiplication in parallel; and a selector that selects one of a parallel output of n bits from said vector multiplier and an externally input initial data comprising of n bits to input to said register.

7. The spreading code generator according to claim 5, wherein said initial value generator includes:

a first register having k storage elements, where k is a natural number except 1, and capable of parallel input and output of k-bit data;

a vector operation coefficient generator that generates one of a first vector operation coefficient that provides predetermined amount of shift corresponding to a number of bits of said bit circulative shift register and a second vector operation coefficient that provides certain amount of shift required for bit extension of an M-sequence initial value;

a vector multiplier that multiplies each of k-bit data output in parallel from said first register by one of said first vector operation coefficient and by said second vector operation coefficient, to provide as parallel output k-bit data obtained as a result of said multiplication;

a selector that selects one of a k-bit parallel output from said vector multiplier as a result of said multiplication of said first vector operation coefficient and an externally input k-bit initial data, said selector providing a selected one of the k-bit parallel output and k-bit initial data as its parallel output to said first register; and a second register that stores at least a part of k-bit data output in parallel from said vector multiplier as a result of said multiplication of said second vector operation coefficient, said second register serving to output in parallel at least a part of said stored data as M-sequence initial value extension bits, wherein data bits output in parallel from said first register and from said second register are summed to obtain an M-sequence initial value.

8. A spreading code generator using vector operations to perform processing substantially equivalent to generation, with a bit circulative shift register, of M-sequence spreading codes expressed by a predetermined generator polynomial, said bit circulative shift register having n storage elements, where n is a natural number except 1, said spreading code generator comprising:

a register having n storage elements and capable of parallel input and output of n-bit data;

an initial value generator that generates an initial value of said register and that provides as parallel output generated n-bit data;

a vector operation coefficient generator that generates one of a first vector operation coefficient that provides a certain amount of shift corresponding to n bits of said bit circulative shift register and a second vector operation coefficient that provides an amount of shift corresponding to the number of bits from the terminal end of one M-sequence spreading code up to the initial value of M-sequence spreading code to next be generated;

a vector multiplier that multiplies each of n-bit data output in parallel from said register by one of said first and second vector operation coefficient, to output in parallel n-bit data obtained as a result of said multiplication; and a selector that selects one of an n-bit parallel output of said vector multiplier and an n-bit parallel output of said initial value generator, said selector capable of providing a selected one output as its parallel output to said register.

9. A spreading code generator using vector operations to perform processing substantially equivalent to generation, with a bit circulative shift register, of M-sequence spreading codes expressed by a predetermined generator polynomial, said bit circulative shift register having n storage elements where n is a natural number except 1, said spreading code generator comprising:

a register having n storage elements and capable of parallel input and output of n-bit data;

a vector operation coefficient generator that generates one of a first vector operation coefficient that provides the amount of shift corresponding to n bits of said bit circulative shift register and a second vector operation coefficient that provides a shift required for generation of data corresponding to an initial value of said bit circulative shift register;

a vector multiplier that multiplies each of n-bit data output in parallel from said register by one of said first vector operation coefficient and by said second vector operation coefficient, to provide as parallel output n-bit data obtained as a result of said multiplication; and a selector that selects one of a n-bit parallel output of said vector multiplier and a reference value required for generation of data corresponding to said initial value of said bit circulative shift register, said register capable of providing selected one of the n-bit parallel output and the reference value as its output to said register.

10. A spreading code generator using vector operations to perform processing substantially equivalent to generation, with a bit circulative shift register, of M-sequence spreading codes expressed by a predetermined generator polynomial, said bit circulative shift register having n storage elements, where n is a natural number except 1, said spreading code generator comprising:

a register having n storage elements and capable of parallel input and output of n data bits;

a vector operation coefficient generator that generates one of a first vector operation coefficient that provides an amount of shift corresponding to n bits of said bit circulative shift register and a second vector operation coefficient that provides a shift required for generation of data corresponding to an initial value of said bit circulative shift register;

a first vector multiplier that multiplies each of n bit data bits output in parallel from said register by one of said first vector operation coefficient and by said second vector operation coefficient, to output in parallel each of n data bits resulting from said multiplication as spreading codes for quadrature components of quadrature modulation signals or for in-phase components thereof;

a selector that selects one of n data bits output in parallel from said first vector multiplier and a reference value required for generation of data corresponding to said initial value of said bit circulative shift register, said selector capable of providing selected one of the n data bits output and the reference value as its output to said register; and a second vector multiplier that multiplies each of n-bit parallel output data from said register by a vector operation coefficient, to thereby acquire n data bits whose phase has been shifted by a desired number of bits, said second vector multiplier outputs in parallel the resultant n data bits as spreading codes for in-phase components of one of quadrature modulation signals and for quadrature components thereof.

11. A spreading code generator using vector operations to perform processing substantially equivalent to generation, with a bit circulative shift register, of M-sequence spreading codes expressed by a predetermined generator polynomial, said bit circulative shift register having n storage elements, where n is a natural number except 1, said spreading code generator comprising:

a plurality of registers each having n storage elements and each capable of parallel input and output of n data bits;

a selector that selects n data bits output in parallel from one of a plurality of registers;

a vector operation coefficient generator that generates one of a first vector operation coefficient that provides the amount of shift corresponding to n bits of said bit circulative shift register and a second vector operation coefficient that provides a shift required for generation of data corresponding to an initial value of said bit circulative shift register;

a vector multiplier that multiplies each of n-bit data output in parallel from said selector by one of said first vector operation coefficient and by said second vector operation coefficient, said vector multiplier providing as its parallel output n-bit data obtained as a result of said multiplication; and a selector that selects one of n bits data output in parallel from said vector multiplier and a reference value required for generation of data corresponding to said initial value of said bit circulative shift register, said selector capable of providing the selected one of the n bits data output and the reference value as its output to each of said plurality of registers.

12. A correlation detector comprising:

a spreading code generator as recited in claim 5;

a correlation detector; and a RAM that temporarily stores received spreading modulation signals;

wherein said correction detector latches said spreading modulation signals stored in said RAM, and said spreading code generator generates different spreading codes in a successive manner, said spreading modulation signals latched in said correction detector being multiplied by said different spreading codes to thereby detect correlations.

13. A spreading spectrum signal receiving apparatus comprising:

a correlation detector as recited in claim 12.

14. A mobile communication terminal apparatus making use of a correlation detector as recited in claim 12 to acquire a synchronism of spreading spectrum modulation signals.

15. A mobile communication system making use of a mobile communication terminal apparatus as recited in claim 14 to provide a communication control.

16. A spreading code generator comprising:

an M-sequence generator;

a bit-width varier that varies the bit width of an output of said M-sequence generator;

a register that allows parallel input and output and that temporarily stores spreading codes;

a vector operation coefficient output that provides, as its output, a vector operation coefficient that provides the amount of shift for successive output of said spreading codes based on vector operations;

a vector operator that multiplies output of said register by said vector operation coefficient; and a selector that allows a selective output of one of an output of said bit-width varier and an output of said vector operator.

17. A spreading code generator comprising:

a register that temporarily stores spreading codes;

a first vector operation coefficient output that provides as its output a first vector operation coefficient that imparts a phase shift by the amount of shift externally specified to an externally input M-sequence spreading code reference value;

a second vector operation coefficient output that provides as its output a second vector operation coefficient that provides the amount of shift for successive output of M-sequence spreading codes based on vector operations;

a vector operator that multiplies an output of said register by one of said first vector operation coefficient and by said second vector operation coefficient; and a selector that allows a selective output of one of an external input data and an output of said vector operation circuit.

18. A spreading code generator comprising:

a register that temporarily stores M-sequence spreading codes;

a first vector operation coefficient storage that stores a first vector operation coefficient externally specified that imparts a predetermined amount of phase shift to an M-sequence spreading code reference value;

a second vector operation coefficient storage that stores a second vector operation coefficient externally specified that provides a shift required for successive output of M-sequence spreading codes based on vector operations;

a vector operator that multiplies output of said register by said first vector operation coefficient or by said second vector operation coefficient; and a selector that allows a selective output of either externally input data or output of said vector operation circuit.

19. A spreading code generator comprising:

a register that for temporarily stores M-sequence spreading codes;

a first vector operation coefficient output that provides as its output a first vector operation coefficient that imparts a phase shift by the amount of shift externally specified to an M-sequence spreading code reference value;

a second vector operation coefficient output that provides as its output a second vector operation coefficient that provides a phase shift required for successive output of M-sequence spreading codes based on vector operations;

a first vector operator that multiplies output of said register by said first vector operation coefficient or by said second vector operation coefficient;

a selector that allows a selective output of either external input or output of said first vector operation circuit;

a third vector operation coefficient output that provides as its output a third vector operation coefficient that imparts a phase shift by the amount of shift externally specified to output of said register; and a second vector operator that makes vector operations of both output of said third vector operation coefficient output circuit and output of said register, said second vector operator provides as its output the results of vector operations;

wherein said spreading code generator provides simultaneous parallel output of two series of M-sequence spreading codes having a phase difference externally specified.

20. A spreading code generator comprising:

a plurality of spreading code storages;

a spreading code selector that makes a selection of any one of outputs of said plurality of spreading code storages;

a first vector operation coefficient output that provides, as its output, a first vector operation coefficient that imparts a phase shift by the amount of shift externally specified to a reference value of M-sequence spreading codes;

a second vector operation coefficient output that provides as its output a second vector operation coefficient that provides a phase shift required for successive output of said M-sequence spreading codes based on vector operations;

a vector operation coefficient selector that allows a selective output of one of an output of said first vector operation coefficient output and an output of said second vector operation coefficient output;

a vector operator that multiplies spreading codes selected by said spreading code selector, by a vector operation coefficient selected by said vector operation coefficient selector; and a plurality of storage data selectors that each allow a selective output of any one of output of each of said plurality of spreading code storage, output of said vector operator, and externally input data;

wherein said spreading code generator executes operations while switching in time-sharing mode respective outputs of said spreading code selector and of said vector operation coefficient selector, to thereby issue spreading codes in different operational conditions on a time-sharing basis.

* * * * *